(12) United States Patent
Ishida et al.

(10) Patent No.: US 11,271,361 B2
(45) Date of Patent: Mar. 8, 2022

(54) EXCIMER LASER APPARATUS AND METHOD FOR MANUFACTURING ELECTRONIC DEVICE

(71) Applicant: Gigaphoton Inc., Tochigi (JP)

(72) Inventors: Keisuke Ishida, Oyama (JP); Satoshi Komuro, Oyama (JP); Hiroshi Furusato, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/849,618

(22) Filed: Apr. 15, 2020

(65) Prior Publication Data
US 2020/0244032 A1 Jul. 30, 2020

Related U.S. Application Data

(63) Continuation of application No. PCT/JP2017/042382, filed on Nov. 27, 2017.

(51) Int. Cl.
*G03F 7/20* (2006.01)
*H01S 3/134* (2006.01)
(Continued)

(52) U.S. Cl.
CPC .......... *H01S 3/134* (2013.01); *G03F 7/70025* (2013.01); *H01S 3/036* (2013.01);
(Continued)

(58) Field of Classification Search
CPC ...... H01S 3/134; H01S 3/036; H01S 3/09702; H01S 3/1305; H01S 3/038; H01S 3/225;
(Continued)

(56) References Cited

U.S. PATENT DOCUMENTS

| 9,130,337 B1 | 9/2015 | O'Brien et al. |
| 2002/0196823 A1 | 12/2002 | Nakao et al. |

(Continued)

FOREIGN PATENT DOCUMENTS

| CN | 1438545 A | 8/2003 |
| CN | 107112712 A | 8/2017 |

(Continued)

OTHER PUBLICATIONS

International Search Report issued in PCT/JP2017/042382; dated Feb. 13, 2018.

(Continued)

*Primary Examiner* — Mesfin T Asfaw
(74) *Attorney, Agent, or Firm* — Studebaker & Brackett PC

(57) ABSTRACT

An excimer laser apparatus according to the present disclosure includes a chamber configured to accommodate a laser gas and a pair of electrodes and generate pulse-oscillating laser light when the gas pressure of the laser gas is controlled in accordance with voltage applied between the pair of electrodes, a power supply configured to apply the voltage between the pair of electrodes, and a controller to which a target value of the spectral linewidth of the laser light is inputted, the controller configured to correct the voltage used to control the gas pressure, when the target value changes from a first target value to a second target value, based on a first function having the second target value as a parameter and control the gas pressure in accordance with the corrected voltage.

5 Claims, 13 Drawing Sheets

(51) Int. Cl.
*H01S 3/036* (2006.01)
*H01S 3/097* (2006.01)
*H01S 3/13* (2006.01)
*H01S 3/038* (2006.01)
*H01S 3/225* (2006.01)

(52) U.S. Cl.
CPC ........ *H01S 3/09702* (2013.01); *H01S 3/1305* (2013.01); *H01S 3/038* (2013.01); *H01S 3/225* (2013.01)

(58) Field of Classification Search
CPC .... H01S 3/2251; H01S 2301/08; H01S 3/106; H01S 3/08004; H01S 3/1306; H01S 3/0971; H01S 3/10069; H01S 3/1055; H01S 3/137; G03F 7/70025; G03F 7/70575; G03F 7/20
See application file for complete search history.

(56) References Cited

U.S. PATENT DOCUMENTS

| | | |
|---|---|---|
| 2003/0081643 A1 | 5/2003 | Takehisa et al. |
| 2003/0142715 A1 | 7/2003 | Nagai |
| 2007/0001127 A1 | 1/2007 | Reiley et al. |
| 2007/0014326 A1 | 1/2007 | Wakabayashi et al. |
| 2008/0285602 A1 | 11/2008 | Nagai et al. |
| 2013/0100980 A1* | 4/2013 | Abe ........................ H01S 3/225 372/57 |
| 2013/0107899 A1 | 5/2013 | Matsunaga et al. |
| 2017/0222391 A1 | 8/2017 | Moriya et al. |
| 2018/0196347 A1 | 7/2018 | Minegishi et al. |
| 2018/0261973 A1 | 9/2018 | Fujimaki et al. |
| 2019/0036290 A1 | 1/2019 | Asayama |

FOREIGN PATENT DOCUMENTS

| | | |
|---|---|---|
| JP | 2002-223020 A | 8/2002 |
| JP | 2003-008119 A | 1/2003 |
| JP | 2003-142758 A | 5/2003 |
| JP | 2003-298163 A | 10/2003 |
| JP | 2006-024855 A | 1/2006 |
| JP | 4911558 B2 | 4/2012 |
| JP | 2012-104846 A | 5/2012 |
| JP | 2013-098239 A | 5/2013 |
| JP | 2013-110381 A | 6/2013 |
| JP | 2017-527994 A | 9/2017 |
| WO | 2017/068619 A1 | 4/2017 |
| WO | 2017/094459 A1 | 6/2017 |
| WO | 2017/195244 A1 | 11/2017 |

OTHER PUBLICATIONS

International Preliminary Report on Patentability and Written Opinion issued in PCT/JP2017/042382; dated Jun. 2, 2020.

An Office Action issued by the State Intellectual Property Office of the People's Republic of China dated Jan. 7, 2022, which corresponds to Chinese Patent Application No. CN 201780095631.8 with English Translation.

An Office Action mailed by the Japanese Patent Office dated Jan. 11, 2022, which corresponds to Japanese Patent Application No. 2019-556072 with English Translation.

* cited by examiner

EXCIMER LASER APPARATUS AND METHOD FOR MANUFACTURING ELECTRONIC DEVICE

CROSS-REFERENCE TO RELATED APPLICATIONS

The present application is a continuation application of International Application No. PCT/JP2017/042382, filed on Nov. 27, 2017, the entire contents of which are hereby incorporated by reference.

BACKGROUND

1. Technical Field

The present disclosure relates to an excimer laser apparatus and a method for manufacturing an electronic device.

2. Related Art

In recent years, a semiconductor exposure apparatus (hereinafter referred to as "exposure apparatus") is required to improve the resolution thereof as a semiconductor integrated circuit is increasingly miniaturized and highly integrated. To this end, reduction in the wavelength of the light emitted from a light source for exposure is underway. A gas laser apparatus is typically used as the light source for exposure in place of a mercury lamp in related art. For example, a KrF excimer laser apparatus, which is configured to emit ultraviolet laser light having a wavelength of 248 nm, and an ArF excimer laser apparatus, which is configured to emit ultraviolet laser light having a wavelength of 193 nm, are used as the gas laser apparatus for exposure.

As a next-generation exposure technology, liquid-immersion exposure, in which the gap between the exposure lens of the exposure apparatus and a wafer is filled with a liquid, has been put into use. In the liquid-immersion exposure, since the refractive index of the gap between the exposure lens and the wafer changes, the apparent wavelength of the light from the light source for exposure is shortened. In the liquid-immersion exposure with an ArF excimer laser apparatus as the light source for exposure, the wafer is irradiated with ultraviolet light having an in-water wavelength of 134 nm. The technology described above is called ArF liquid-immersion exposure (or ArF liquid-immersion lithography).

A KrF excimer laser apparatus and an ArF excimer laser apparatus each have a wide spectral linewidth ranging from about 350 to 400 pm in spontaneous oscillation. The chromatic aberrations therefore occur in some cases when the projection lens is made of a material that transmits ultraviolet light, such as the KrF laser light and ArF laser light. As a result, the resolution could decrease. To avoid the decrease in the resolution, the spectral linewidth of the laser light emitted from the gas laser apparatus needs to be narrow enough to make the chromatic aberrations negligible. A line narrowing module (LNM) including a line narrowing element (such as etalon and grating) is therefore provided in the laser resonator of the gas laser apparatus to narrow the spectral linewidth. A laser apparatus having a narrowed spectral linewidth is hereinafter referred to as a narrowed-linewidth laser apparatus.

CITATION LIST

Patent Literature

[PTL 1] JP-A-2012-104846
[PTL 2] JP-A-2013-98239
[PTL 3] Japanese Patent No. 4,911,558

SUMMARY

An excimer laser apparatus according to the present disclosure includes a chamber configured to accommodate a laser gas and a pair of electrodes and generate pulse-oscillating laser light when gas pressure of the laser gas is controlled in accordance with voltage applied between the pair of electrodes, a power supply configured to apply the voltage between the pair of electrodes, and a controller to which a target value of a spectral linewidth of the laser light is inputted, the controller configured to correct the voltage used to control the gas pressure, when the target value changes from a first target value to a second target value, based on a first function having the second target value as a parameter and control the gas pressure in accordance with the corrected voltage.

A method for manufacturing an electronic device according to the present disclosure includes generating pulse-oscillating laser light by using a laser system, outputting the laser light to an exposure apparatus, and exposing a light sensitive substrate with the laser light via the exposure apparatus to manufacture the electronic device, the laser system including a chamber configured to accommodate a laser gas and a pair of electrodes and generate the laser light when gas pressure of the laser gas is controlled in accordance with voltage applied between the pair of electrodes, a power supply configured to apply the voltage between the pair of electrodes, and a controller to which a target value of a spectral linewidth of the laser light is inputted, the controller configured to correct the voltage used to control the gas pressure, when the target value changes from a first target value to a second target value, based on a first function having the second target value as a parameter and control the gas pressure in accordance with the corrected voltage.

BRIEF DESCRIPTION OF THE DRAWINGS

Embodiments of the present disclosure will be described below only by way of example with reference to the accompanying drawings.

DETAILED DESCRIPTION

Figure 1:
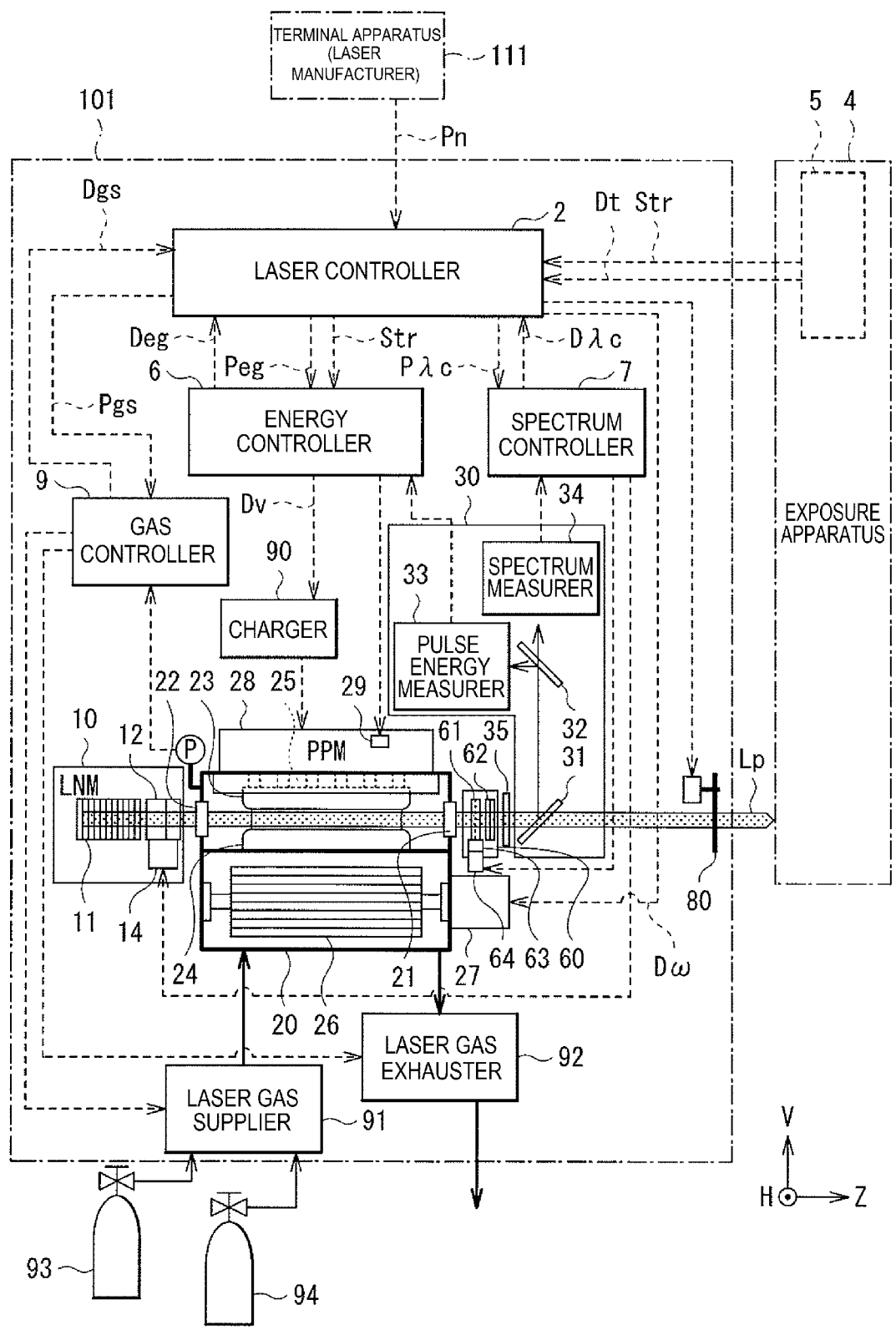
FIG. 1 schematically shows an example of the configuration of a laser apparatus according to Comparative Example.

<Contents>
<1. Comparative Example> (FIGS. 1 to 11)
1.1 Configuration
1.2 Operation
1.3 Problems
<2. First embodiment> (Example of improvement in gas pressure control) (FIG. 12)
2.1 Configuration
2.2 Operation
2.3 Effects and Advantages
<3. Second embodiment> (Example of improvement in spectral linewidth control) (FIG. 13)
3.1 Configuration
3.2 Operation
3.3 Effects and Advantages
<4. Third embodiment> (Example of improvement in spectral linewidth measurement) (FIG. 14)
4.1 Configuration
4.2 Operation
4.3 Effects and Advantages
<5. Fourth embodiment> (Specific example of spectrum measurer) (FIGS. 15 and 16)
5.1 Configuration
5.2 Operation
5.3 Effects and Advantages
<6. Fifth embodiment> (method for manufacturing electronic device) (FIG. 17)
<7. Others>

Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure.

The same component has the same reference character, and no redundant description of the same component will be made.

1. COMPARATIVE EXAMPLE 1.1 Configuration

FIG. 1 schematically shows an example of the configuration of a laser apparatus 101 according to Comparative Example. In FIG. 1, several signal lines are omitted.

In the present specification, a direction Z is the direction of the optical path axis of laser light. Two directions substantially perpendicular to the direction Z may be directions H and V. The direction H is a direction substantially perpendicular to the plane of view of FIG. 1.

The laser apparatus 101 according to Comparative Example is an excimer laser apparatus. A variety of control parameters in the laser apparatus 101 may be changeable based on a control parameter change data Pn received from an external terminal apparatus 111. The terminal apparatus 111 is a terminal, such as a personal computer (PC) operated by the manufacturer of the laser apparatus 101, which is a laser manufacturer. The terminal apparatus 111 may, for example, be a server connected to a plurality of apparatuses including the laser apparatus 101 over a network.

The laser apparatus 101 is a light source apparatus configured to output pulsed laser light Lp as the laser light. The laser apparatus 101 includes a laser output section configured to perform laser oscillation to output the pulsed laser light Lp toward an exposure apparatus 4. The laser output section includes a laser chamber 20, to which a laser gas is supplied, a line narrowing module (LNM) 10, and an output coupling mirror 35 as an output coupler (OC).

The laser apparatus 101 includes an exit shutter 80, which is disposed on the optical path between the laser output section and the exposure apparatus 4. The exit shutter 80 is opened when the laser output section outputs the laser light toward the exposure apparatus 4. The exit shutter 80 is closed, for example, when the laser output section performs the laser oscillation but stops outputting the laser light toward the exposure apparatus 4. The exit shutter 80 is closed, for example, when the laser output section performs adjustment oscillation.

The exposure apparatus 4 is an apparatus configured to perform wafer exposure. The wafer exposure includes scanning exposure. The term "scanning exposure" is a method for exposing an exposure area of a wafer to light while scanning the exposed area with the pulsed laser light Lp.

The laser apparatus 101 undergoes burst operation in association with the wafer exposure performed by the exposure apparatus 4. The "burst operation" is operation that alternately repeats a burst period in which the pulsed laser light Lp having narrowed linewidth is continuously emitted in accordance with the scanning exposure and a non-oscillation period in which the laser oscillation does not occur.

The laser apparatus 101 further includes a laser controller 2, an energy controller 6, a spectrum controller 7, and a gas controller 9. The laser apparatus 101 further includes a monitor module (MM) 30, a spectrum changer 60, a charger 90, a laser gas supplier 91, and a laser gas exhauster 92.

A signal line is provided between the terminal apparatus 111 and the laser controller 2, and the signal line is configured to transmit the control parameter change data Pn, which is data that changes the variety of control parameters in the laser apparatus 101, and a control parameter transmission request signal, which requests transmission of the control parameter change data Pn from the terminal apparatus 111 to the laser controller 2, from the terminal apparatus 111 to the laser controller 2.

A signal line configured to transmit a variety of target data Dt from an exposure apparatus controller 5 to the laser controller 2 is provided between the exposure apparatus controller 5 and the laser controller 2. The variety of target data Dt contains target pulse energy Et, a target wavelength λt, and a target spectral linewidth Δλt.

The laser chamber 20 includes windows 21 and 22, a pair of discharge electrodes 23 and 24, an electrically insulating member 25, a cross-flow fan (CFF) 26, a motor 27, and a pulse power module (PPM) 28.

The electrically insulating member 25 may, for example, be made of alumina ceramic. The pulse power module 28 includes a switch 29 and is connected to the discharge electrode 23 via a feedthrough that is not shown but is part of the electrically insulating member 25. The discharge electrode 24 is connected to the laser chamber 20, which is grounded.

A line narrowing module 10 and the output coupling mirror 35 form an optical resonator as the laser resonator. The laser chamber 20 is so disposed that a discharge area of the pair of discharge electrodes 23 and 24 are located on the optical path of the optical resonator. The output coupling mirror 35 is coated with a multilayer film that reflects part of the laser light produced in the laser chamber 20 and transmits part thereof.

The line narrowing module 10 includes a grating 11, a prism 12, and a rotary stage 14, which rotates the prism 12.

The prism 12 is so disposed that the laser light outputted from the laser chamber 20 is enlarged in terms of beam diameter by the prism 12 and the enlarged laser light is incident on the grating 11 at a predetermined angle.

The rotary stage 14 is so disposed that the angle of incidence of the laser beam incident on the grating 11 changes when the prism 12 rotates. The grating 11 is disposed in the Littrow arrangement, which causes the angle of incidence of the laser beam incident on the grating 11 to be equal to the angle of the laser beam diffracted off the grating 11.

The charger 90 and the pulse power module 28 are so electrically connected to each other that a charge capacitor of the pulse power module 28 that is not shown but has a capacity C0 is charged. The charger 90 is configured to receive charge voltage data Dv representing charge voltage V from the energy controller 6.

A light emission trigger signal Str is inputted from the exposure apparatus controller 5 of the exposure apparatus 4 to the laser controller 2. The light emission trigger signal Str is inputted to the energy controller 6 via the laser controller 2. The energy controller 6 and the pulse power module 28 are so electrically connected to each other that the switch 29 is turned on and off in synchronization with the light emission trigger signal Str.

The monitor module 30 includes beam splitters 31 and 32, a pulse energy measurer 33, and a spectrum measurer 34.

The beam splitter 31 is disposed in the optical path of the pulsed laser light Lp outputted from the output coupling mirror 35. The beam splitter 32 is disposed in the optical path of the pulsed laser light Lp reflected off the beam splitter 31. The beam splitter 32 is so disposed that the light reflected off the beam splitter 32 is incident on the pulse energy measurer 33 and the light passing through the beam splitter 32 enters the spectrum measurer 34.

The pulse energy measurer 33 includes a light collection lens and an optical sensor that are not shown. The optical sensor may be a high-speed photodiode resistant to ultraviolet light.

The spectrum measurer 34 may be a spectrometer including an etalon that is not shown. The spectrum measurer 34 may be, for example, a monitor etalon spectrometer including a monitor etalon that is not shown, a light collection lens, and an image sensor configured to measure interference fringes that pass through the monitor etalon and are generated in the focal plane by the light collection lens. The spectrum measurer 34 is a spectral waveform measurer configured to measure the spectral linewidth Δλ and the central wavelength of the laser light on a pulse basis.

A signal line configured to transmit a stage angle control signal for controlling a rotary stage angle θ of the rotary stage 14 from the spectrum controller 7 to the rotary stage 14 is provided between the spectrum controller 7 and the rotary stage 14 in the line narrowing module 10. The rotary stage angle θ of the rotary stage 14 is controlled based on the wavelength λ detected with the spectrum measurer 34.

A signal line configured to transmit spectrum control related data Dλc based on the result of the measurement performed by the spectrum measurer 34 from the spectrum controller 7 to the laser controller 2 is provided between the spectrum controller 7 and the laser controller 2.

The spectrum changer 60 is disposed on the optical path between the laser chamber 20 and the output coupling mirror 35. The spectrum changer 60 includes a cylindrical concave lens 61, a cylindrical convex lens 62, and a linear stage 63. The spectrum changer 60 includes an actuator 64, which is configured to adjust the stage position (position X) of the linear stage 63. The spectrum changer 60, as a variation thereof, may be so configured that one of the surfaces of the cylindrical convex lens 62 that is farthest from the laser chamber 20 is a flat surface and the flat surface is coated with a partially reflective film so that the flat surface also functions as the output coupling mirror. In this case, the output coupling mirror 35 is not disposed.

The spectrum changer 60 is a wavefront adjuster. The cylindrical concave lens 61 and the cylindrical convex lens 62 are each an optical member configured to adjust the wavefront of the laser light that travels back and forth through the laser resonator. At least one of the cylindrical concave lens 61 and the cylindrical convex lens 62 is placed on the linear stage 63. The cylindrical concave lens 61 and the cylindrical convex lens 62 are disposed in the optical path between the laser chamber 20 and the output coupling mirror 35. The inter-lens distance between the cylindrical concave lens 61 and the cylindrical convex lens 62 is changed by the linear stage 63.

A signal line configured to transmit a stage position control signal for controlling the stage position (position X) of the linear stage 63 from the spectrum controller 7 to the actuator 64 is provided between the spectrum controller 7 and the actuator 64.

A signal line configured to transmit data on the target wavelength λt and the target spectral linewidth Δλt for spectrum control from the laser controller 2 to the spectrum controller 7 is provided between the laser controller 2 and the spectrum controller 7. A signal line configured to transmit spectrum control parameter Pλc for the spectrum control from the laser controller 2 to the spectrum controller 7 is provided between the laser controller 2 and the spectrum controller 7.

A signal line configured to transmit the charge voltage data Dv representing the charge voltage V from the energy controller 6 to the charger 90 is provided between the energy controller 6 and the charger 90. The charge voltage V is controlled based on pulse energy E measured with the pulse energy measurer 33. The charge voltage V is voltage that charges the charge capacitor that is not shown but is part of the pulse power module 28.

A signal line configured to transmit energy-control-related data Deg based on the result of the measurement performed by the pulse energy measurer 33 from the energy controller 6 to the laser controller 2 is provided between the energy controller 6 and the laser controller 2.

A signal line configured to transmit gas-control-related data Dgs from the gas controller 9 to the laser controller 2 is provided between the gas controller 9 and the laser controller 2.

The laser gas supplier 91 is configured to be capable of supplying the interior of the laser chamber 20 with a buffer gas and a fluorine-containing gas as the laser gas based on a control signal from the gas controller 9. The buffer gas is an Ar+Ne mixture gas. The fluorine-containing gas is an Ar+Ne+$F_2$ mixture gas. The laser gas supplier 91 is connected to a gas cylinder 93, which is configured to supply the Ar+Ne mixture gas as the buffer gas, and a gas cylinder 94, which is configured to supply the Ar+Ne+$F_2$ mixture gas as the fluorine-containing gas. The laser gas supplier 91 includes a valve configured to control the supply of the Ar+Ne mixture gas from the gas cylinder 93 and a valve configured to control the supply of the Ar+Ne+$F_2$ mixture gas from the gas cylinder 94.

The laser gas exhauster 92 is configured to be capable of exhausting the laser gas in the laser chamber 20 in response to a control signal from the gas controller 9. The laser gas exhauster 92 includes a valve configured to control the exhaust operation, an exhaust pump, and a halogen filter that traps the $F_2$ gas in the exhaust gas.

A signal line configured to transmit a gas control parameter Pgs for performing gas control from the laser controller 2 to the gas controller 9 is provided between the laser controller 2 and the gas controller 9.

A signal line configured to transmit data on the target pulse energy Et for energy control from the laser controller 2 to the energy controller 6 is provided between the laser controller 2 and the energy controller 6. A signal line configured to transmit the light emission trigger signal Str from the laser controller 2 to the energy controller 6 is provided between the laser controller 2 and the energy controller 6. A signal line configured to transmit an energy control parameter Peg for performing the energy control from the laser controller 2 to the energy controller 6 is provided between the laser controller 2 and the energy controller 6.

A signal line that transmits data on the target wavelength λt and data on the target spectral linewidth Δλt for performing the spectrum control to the spectrum controller 7 is provided between the laser controller 2 and the spectrum controller 7.

A signal line configured to transmit rotational speed data Dω for controlling the rotational speed ω of the cross-flow fan 26 from the laser controller 2 to the motor 27 is provided between the laser controller 2 and the motor 27 of the laser chamber 20.

The laser controller 2 includes a storage that is not shown but is configured to store the variety of control parameters.

(Spectral Linewidth)

Figure 2:
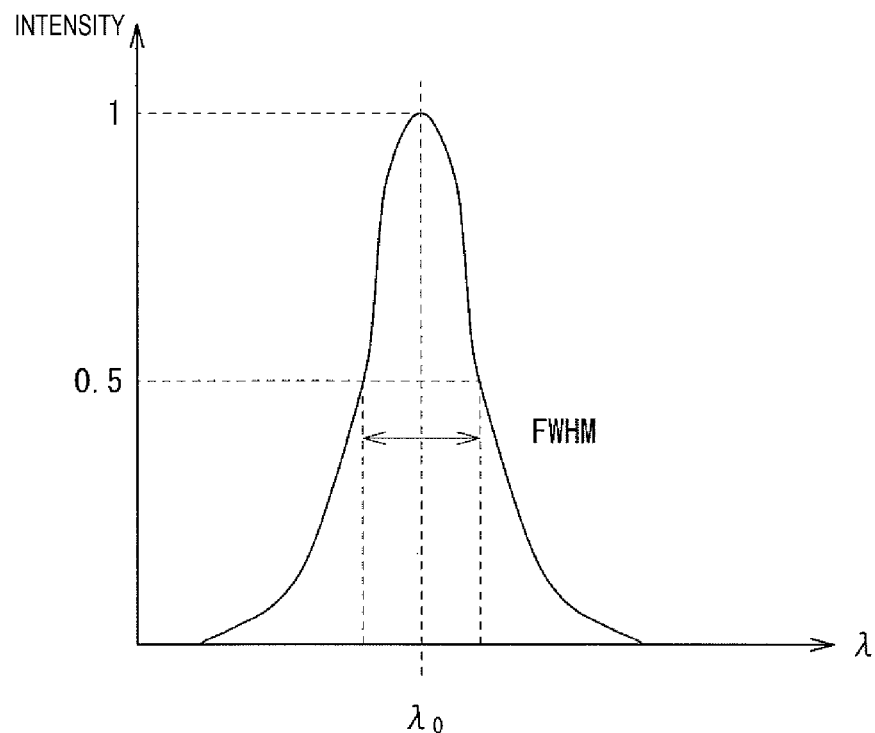
FIG. 2 shows an overview of FWHM as an example of a spectral linewidth.
Figure 3:
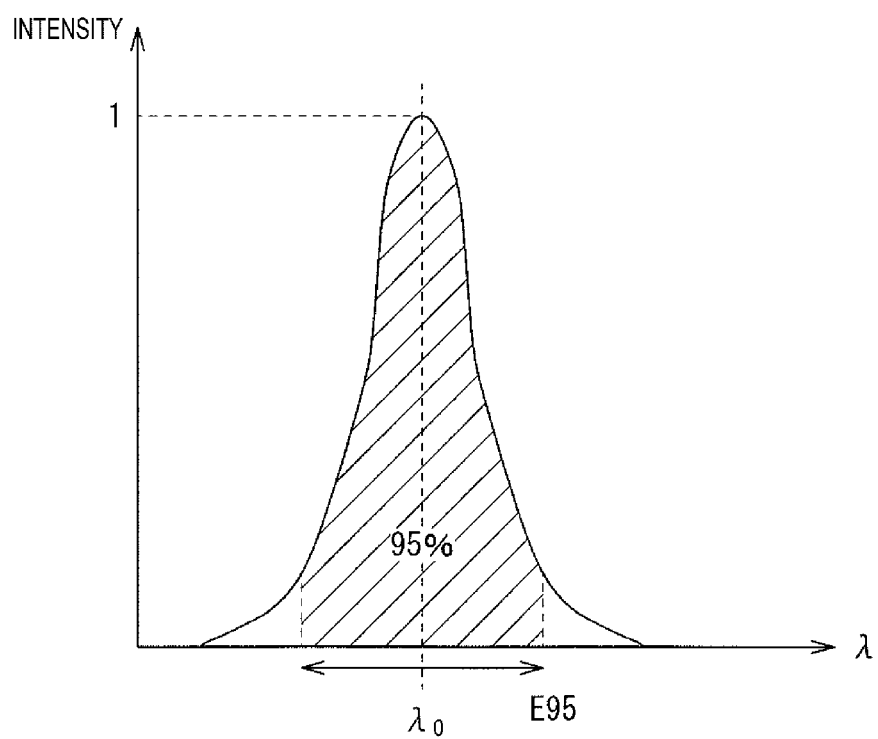
FIG. 3 shows an overview of E95 as an example of the spectral linewidth.

FIG. 2 shows an overview of FWHM as an example of the spectral linewidth. FIG. 3 shows an overview of E95 as an example of the spectral linewidth. In FIGS. 2 and 3, the horizontal axis represents the wavelength λ, and the vertical axis represents the optical intensity.

The spectral linewidth is the full width of the spectral waveform of the laser light at a light quantity threshold. It is assumed in the present specification that a relative value of each light quantity threshold with respect to a light quantity peak value is a linewidth threshold Thresh (0<Thresh<1).

For example, a half of a light quantity peak value is called a linewidth threshold 0.5, as shown in FIG. 2. The full width of a spectral waveform at the linewidth threshold 0.5 is particularly the full width at half maximum or FWHM.

In the present specification, the full width of a portion of a spectral waveform that is the portion, the center of which corresponds to wavelength $\lambda_0$ that accounts for 95% of the overall spectral energy is called spectral purity, as shown in FIG. 3. The spectral linewidth corresponding to the spectral purity is called E95 in the present specification. As for the spectral purity, the following Expression (1) is satisfied, where g(λ) represents a spectral waveform.

[Expression 1]

$$\frac{\int_{-\frac{\Delta\lambda}{2}}^{\frac{\Delta\lambda}{2}} g(\lambda + \lambda_0)d\lambda}{\int_{-\infty}^{\infty} g(\lambda + \lambda_0)d\lambda} = 0.95 \quad (1)$$

1.2 Operation

Figure 4:
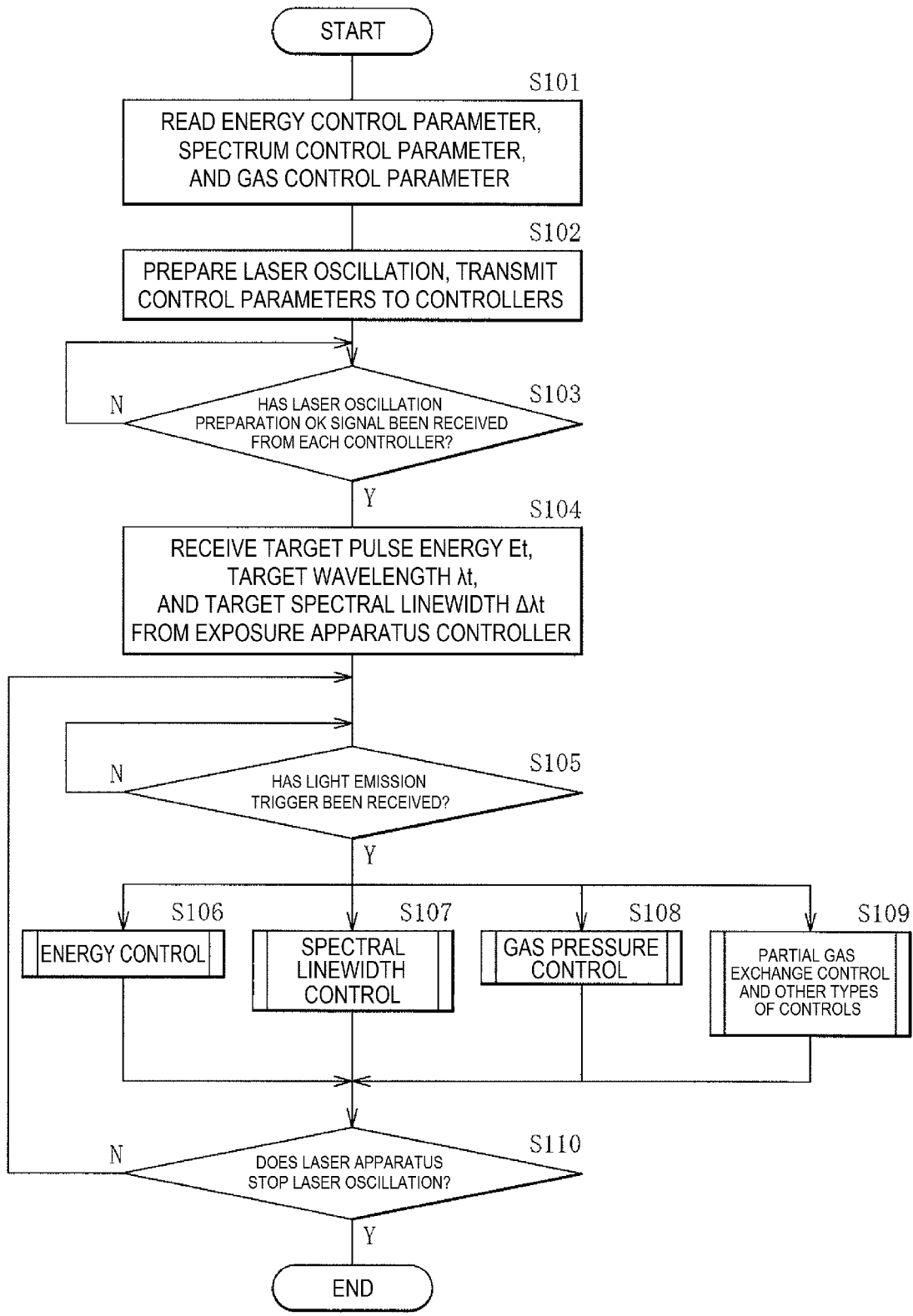
FIG. 4 is a main flowchart showing an example of the procedure of laser oscillation control operation performed by a laser controller in the laser apparatus according to Comparative Example.

FIG. 4 is a main flowchart showing an example of the procedure of laser oscillation control operation performed by the laser controller 2 in the laser apparatus 101 according to Comparative Example.

The laser controller 2 first reads the variety of control parameters including the energy control parameter Peg, the spectrum control parameter Pλc, and the gas control parameter Pgs from the storage that is not shown (step S101). The control parameters are target control parameters for causing the laser performance of the laser apparatus 101 to approach target performance required by the exposure apparatus 4.

The laser controller 2 then prepares the laser oscillation. As the preparation of the laser oscillation, the laser controller 2 transmits the control parameters to the energy controller 6, the spectrum controller 7, and the gas controller 9 (step S102). The laser controller 2 further transmits signals that drive the variety of measurers, the stages, and other components to the controllers as the preparation of the laser oscillation.

The laser controller 2 evaluates whether or not it has received a laser oscillation preparation OK signal from each of the controllers (step S103). When the result of the evaluation shows that the laser oscillation preparation OK signal has not been received from any of the controllers (N in step S103), the laser controller 2 repeats the process in step S103.

When the result of the evaluation shows that the laser oscillation preparation OK signal has been received from each of the controllers (Y in step S103), the laser controller 2 then receives the variety of target data Dt including the target pulse energy Et, the target wavelength λt, and the target spectral linewidth Δλt from the exposure apparatus controller 5 (step S104).

The laser controller 2 then evaluates whether or not it has received the light emission trigger signal Str from the exposure apparatus controller 5 (step S105). When the result of the evaluation shows that the light emission trigger signal Str has not been received (N in step S105), the laser controller 2 repeats the process in step S105.

When the result of the evaluation shows that the light emission trigger signal Str has been received (Y in step S105), the laser controller 2 then causes the energy controller 6, the spectrum controller 7, and the gas controller 9 to perform a variety of types of control in the period for which the light emission trigger signal Str lasts. The variety of types of control include energy control (step S106), spectral linewidth control (step S107), gas pressure control (step S108), and other types of control, such as partial gas exchange control and spectral wavelength control (step S109).

The laser controller 2 then evaluates whether or not the laser apparatus 101 stops the laser oscillation control operation (step S110). Whether or not the laser apparatus 101 stops the laser oscillation control operation is evaluated by evaluating whether or not the laser controller 2 has received a laser apparatus stop signal from the exposure apparatus controller 5. When the result of the evaluation shows that the laser controller 2 has not received the laser apparatus stop signal (N in step S110), the laser controller 2 returns to the process in step S105. When the result of the evaluation shows that the laser controller 2 has received the laser apparatus stop signal (Y in step S110), the laser controller 2 terminates the laser oscillation control operation.

Processes in subroutines in the variety of types of control in steps S106 to S109 in FIG. 4 will next be described in detail.

(Energy Control)

The laser apparatus 101 is configured to perform the following energy control as the subroutine in step S106 in FIG. 4.

The energy controller 6 is configured to perform the energy control based on the energy control parameter Peg. The energy control parameter Peg is a target control parameter for causing the pulse energy E of the pulsed laser light Lp to approach the target pulse energy Et. The energy control parameter Peg contains an energy control gain Vk and an initial value V0 of the charge voltage V.

The laser controller 2 is configured to transmit data on the target pulse energy Et and the light emission trigger signal Str to the energy controller 6. The energy controller 6 is configured to transmit the charge voltage data Dv to the charger 90. The energy controller 6 is configured to transmit an ON signal to the switch 29 of the pulse power module 28 in synchronization with the light emission trigger signal Str. Therefore, in the laser chamber 20, high voltage is applied between the pair of discharge electrodes 23 and 24, and the laser gas undergoes dielectric breakdown in the discharge area between the pair of discharge electrodes 23 and 24, so that discharge occurs. As a result, the laser gas is excited in the laser chamber 20, and laser oscillation occurs between the line narrowing module 10 and the output coupling mirror 35, which form the optical resonator. The pulsed laser light Lp produced by the laser oscillation exits via the output coupling mirror 35.

The beam splitters 31 and 32 separate part of the pulsed laser light Lp having exited via the output coupling mirror 35 as sample light used to detect the pulse energy E, and the sample light enters the pulse energy measurer 33.

The pulse energy measurer 33 is configured to detect the pulse energy E of the pulsed laser light Lp having exited via the output coupling mirror 35. The pulse energy measurer 33 is configured to transmit data on the detected pulse energy E to the energy controller 6.

The energy controller 6 is configured to calculate the charge voltage V for the following pulse based on the difference $\Delta E$ between the pulse energy E and the target pulse energy Et ($=E-Et$).

The energy controller 6 is configured to calculate the following charge voltage V based on $\Delta E$, for example, as shown by the following expression. That is, the energy controller 6 is configured to subtract $Vk \cdot \Delta E$ from the charge voltage V at the time of the measurement of the pulse energy E to calculate the charge voltage V for the following charge operation. The pulse energy control gain Vk is a proportional coefficient that converts $\Delta E$ into the amount of change in the charge voltage V.

$$V = V - Vk \cdot \Delta E$$

where $Vk = \Delta V/\Delta E$.

The energy controller 6 is configured to transmit the charge voltage data Dv representing the calculated charge voltage V to the charger 90 to set the charge voltage V in the charger 90. As a result, the pulse energy E of the pulsed laser light Lp having exited via the output coupling mirror 35 can approach the target pulse energy Et.

(Gas Control)

The gas controller 9 is configured to perform gas pressure control and partial gas exchange control as the gas control. The laser controller 2 is configured to transmit the gas control parameter Pgs to the gas controller 9. The gas control parameter Pgs contains a gas pressure control parameter and a partial gas exchange control parameter. The gas control parameter Pgs is a target control parameter for indirectly causing the pulse energy E of the pulsed laser light Lp to approach the target pulse energy Et.

The gas pressure control parameter contains minimum charge voltage Vmin, maximum charge voltage Vmax, maximum control gas pressure Pmax, and a gas pressure change quantity $\Delta P$. The minimum charge voltage Vmin is the minimum of the charge voltage V. The maximum charge voltage Vmax is the maximum of the charge voltage V. The maximum control gas pressure Pmax is maximum gas pressure in the laser chamber 20 in the state in which the laser is in operation. The gas pressure change quantity $\Delta P$ is the pressure change quantity by which the gas pressure P is increased or decreased.

The partial gas exchange control parameter contains a partial gas exchange cycle Tpg, a buffer gas injection coefficient Kpg, and a fluorine-containing gas injection coefficient Khg. The partial gas exchange cycle Tpg is the cycle in which the partial gas is exchanged. The buffer gas injection coefficient Kpg is the amount of injection of the Ar+Ne mixture gas per unit pulse. The fluorine-containing gas injection coefficient Khg g is the amount of injection of the $Ar+Ne+F_2$ mixture gas per unit pulse.

(Gas Pressure Control)

The laser apparatus 101 is configured to perform the following gas pressure control as the subroutine in step S108 in FIG. 4.

When the laser gas pressure increases, the dielectric breakdown voltage increases, and the pulse energy E of the pulsed laser light Lp that exits via the output coupling mirror 35 increases accordingly. Conversely, when the laser gas pressure decreases, the dielectric breakdown voltage decreases, and the pulse energy E of the pulsed laser light Lp that exits via the output coupling mirror 35 decreases accordingly. The gas controller 9 is configured to perform the gas pressure control by using the characteristics described above.

The gas controller 9 may be configured to measure the gas pressure P in the laser chamber 20 via a pressure sensor. The gas controller 9 may be configured to transmit data on the gas pressure P to the laser controller 2.

When the charge voltage V is greater than or equal to the maximum charge voltage Vmax, the gas controller 9 may be configured to control the laser gas supplier 91 to cause it to inject the Ar+Ne mixture gas into the laser chamber 20 in such a way that the gas pressure P increases by the gas pressure change quantity $\Delta P$. Conversely, when the charge voltage V is smaller than or equal to the minimum charge voltage Vmin, the gas controller 9 may be configured to control the laser gas exhauster 92 to cause it to exhaust the gas in the laser chamber 20 in such a way that the gas pressure P decreases by the gas pressure change quantity $\Delta P$.

Figure 5:
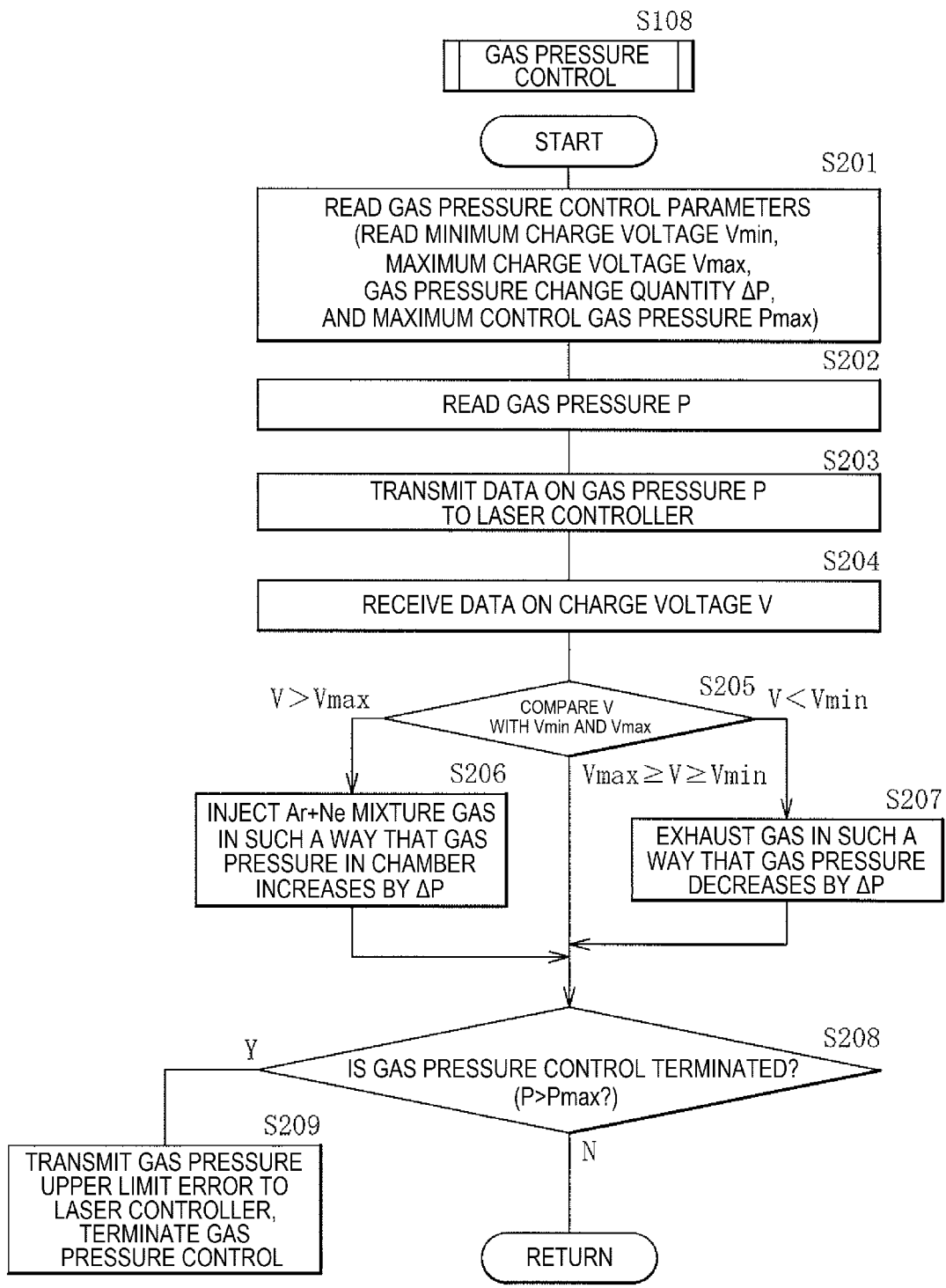
FIG. 5 is a flowchart showing an example of the procedure of control relating to gas pressure control performed by a gas controller in the laser apparatus according to Comparative Example.

FIG. 5 is a flowchart showing an example of the procedure of control relating to the gas pressure control performed by the gas controller 9 in the laser apparatus 101.

The gas controller 9 reads the gas pressure control parameters out of the gas control parameter Pgs (step S201). In this process, the gas controller 9 reads the minimum charge voltage Vmin, the maximum charge voltage Vmax, the maximum control gas pressure Pmax, and the gas pressure change quantity $\Delta P$ as the gas pressure control parameters via the laser controller 2.

The gas controller 9 then reads the gas pressure P in the laser chamber 20 measured with the pressure sensor (step S202).

The gas controller 9 then transmits data on the measured gas pressure P to the laser controller 2 (step S203).

The gas controller 9 then receives the data on the charge voltage V via the laser controller 2 (step S204).

The gas controller 9 then compares the value of the charge voltage V with the minimum charge voltage Vmin and the maximum charge voltage Vmax (step S205). When Vmax≥V≥Vmin is satisfied, the gas controller 9 evaluates whether or not the gas pressure control is terminated (step S208). The evaluation of whether or not the gas pressure control is terminated is performed, for example, by evaluation of whether or not the measured gas pressure P is greater than the maximum control gas pressure Pmax.

When V>Vmax is satisfied, the gas controller 9 controls the laser gas supplier 91 to cause it to inject the Ar+Ne mixture gas into the laser chamber 20 in such a way that the gas pressure P in the laser chamber 20 increases by the gas pressure change quantity $\Delta P$ (step S206). The gas controller 9 then evaluates whether or not the gas pressure control is terminated (step S208).

When V<Vmin is satisfied, the gas controller 9 controls the laser gas exhauster 92 to cause it to exhaust the gas in the laser chamber 20 in such a way that the gas pressure P in the laser chamber 20 decreases by the gas pressure change quantity $\Delta P$ (step S207). The gas controller 9 then evaluates whether or not the gas pressure control is terminated (step S208).

When the result of the evaluation shows that the gas pressure control is not terminated (N in step S208), the gas controller 9 repeats the processes of the gas pressure control. On the other hand, when the result of the evaluation shows that the gas pressure control is terminated (Y in step S208), the gas controller 9 transmits a gas pressure upper limit error signal representing that the gas pressure P has reached the maximum control gas pressure Pmax to the laser controller 2 and terminates the processes of the gas pressure control (step S209).

(Partial Gas Exchange Control)

The laser apparatus 101 is configured to perform the following partial gas exchange control as the subroutine in step S109 in FIG. 4.

In the partial gas exchange control performed by the gas controller 9, the Ar+Ne mixture gas and the Ar+Ne+$F_2$ mixture gas are each injected by a predetermined quantity into the laser chamber 20, for example, in a fixed cycle, and the gas in the laser chamber 20 is then exhausted by the quantity of the injected gas. The partial gas exchange control allows the amount of decrease in the $F_2$ gas in the laser chamber 20 due to the discharge to be replenished. The partial gas exchange control allows the concentration of impurity gases produced in the laser chamber 20 and the concentration of the $F_2$ gas in the laser chamber 20 to each be maintained at a predetermined value. Specifically, the following partial gas exchange control is performed.

The gas controller 9 is configured to calculate $\Delta Ppg$ (=Kpg·N) based on the Ar+Ne mixture gas injection coefficient Kpg and the number of laser oscillation pulses N in the partial gas exchange cycle Tpg. The gas controller 9 is configured to thereafter inject the Ar+Ne mixture gas into the laser chamber 20 in such a way that the gas pressure P in the laser chamber 20 increases by $\Delta Ppg$.

The gas controller 9 is configured to thereafter calculate $\Delta Phg$ (=Khg·N) based on the Ar+Ne+$F_2$ mixture gas injection coefficient Khg and the number of laser oscillation pulses N in the partial gas exchange cycle Tpg. The gas controller 9 is configured to thereafter inject the Ar+Ne+$F_2$ mixture gas into the laser chamber 20 in such a way that the gas pressure P in the laser chamber 20 increases by $\Delta Phg$.

The gas controller 9 is configured to thereafter exhaust the gas in the laser chamber 20 in such a way that the gas pressure P in the laser chamber 20 decreases by ($\Delta Ppg + \Delta Phg$).

The injection of the Ar+Ne mixture gas and the injection of the Ar+Ne+$F_2$ mixture gas may be simultaneously performed.

(Spectrum Control)

The laser apparatus 101 is configured to perform the following spectral linewidth control as the subroutine in step S107 in FIG. 4. The laser apparatus 101 is configured to further perform the following spectral wavelength control as part of the subroutine in step S109 in FIG. 4.

The laser controller 2 is configured to transmit the data on the target wavelength $\lambda t$, the data on the target spectral linewidth $\Delta\lambda t$, and the light emission trigger signal Str to the spectrum controller 7. The spectrum controller 7 is configured to cause the spectrum measurer 34 of the monitor module 30 to measure the wavelength $\lambda t$ and the spectral linewidth $\Delta\lambda$ of the pulsed laser light Lp having exited via the output coupling mirror 35.

The spectrum controller 7 is configured to perform the spectral wavelength control based on the spectrum control parameter P$\lambda$c and the target wavelength $\lambda t$. The spectrum controller 7 is configured to perform the spectral linewidth control based on the spectrum control parameter P$\lambda$c and the target spectral linewidth $\Delta\mu t$. The spectrum control parameter P$\lambda$c contains a wavelength control parameter and a spectral linewidth control parameter. The wavelength control parameter is a target control parameter for causing the wavelength of the pulsed laser light Lp to approach the target wavelength $\lambda t$. The spectral linewidth control parameter is a target control parameter for causing the spectral linewidth of the pulsed laser light Lp to approach the target spectral linewidth $\Delta\lambda t$. The wavelength control parameter may contain a wavelength control gain $\lambda k$ and an initial angle θ0 of the rotary stage 14 in the line narrowing module 10. The initial angle θ0 of the rotary stage 14 corresponds to the initial rotational angle of the prism 12 in the line narrowing module 10. The spectral linewidth control parameter contains a spectral linewidth control gain ΔλK and an initial position X0 of the linear stage 63 in the spectrum changer 60. The initial position X0 of the linear stage 63 corresponds to the initial position of the cylindrical concave lens 61 in the spectrum changer 60.

The spectrum controller 7 is configured to transmit spectrum-control-related data Dλc to the laser controller 2. The spectrum-control-related data Dλc is data containing, for example, the measured wavelength λt and the spectral linewidth Δλ.

(Spectral Wavelength Control)

The spectrum controller 7 is configured to transmit the stage angle control signal to the rotary stage 14 of the line narrowing module 10 based on the difference δλ between the measured wavelength λt and the target wavelength λt in such a way that δλ approaches zero. The stage angle control signal controls the rotary stage angle θ of the rotary stage 14. As a result, the wavelength λ of the pulsed laser light Lp having exited via the output coupling mirror 35 can approach the target wavelength λt. Specifically, the spectrum controller 7 performs the following spectral wavelength control.

The spectrum controller 7 is configured to first set and read the wavelength control parameters out of the spectrum control parameters Pλc. The spectrum controller 7 is configured to set the initial value of the rotary stage angle θ of the rotary stage 14 of the line narrowing module 10 at θ0. The spectrum controller 7 is configured to further read the wavelength control gain λk via the laser controller 2.

The spectrum controller 7 is configured to thereafter read the target wavelength λt from the exposure apparatus controller 5 via the laser controller 2. The spectrum controller 7 is configured to thereafter cause the spectrum measurer 34 to measure the wavelength λ.

The spectrum controller 7 is configured to thereafter transmit data on the measured wavelength λ to the laser controller 2. The spectrum controller 7 is configured to thereafter calculate the difference δλ between the measured wavelength λ and the target wavelength λt (=λ−λt).

The spectrum controller 7 is configured to thereafter calculate the following rotary stage angle θ based on δλ as shown by the following expression. That is, the spectrum controller 7 is configured to subtract Δk·δλ from the rotary stage angle θ of the rotary stage 14 at the time of the measurement of the wavelength λ to calculate the following stage angle. The wavelength control gain λk is a proportional coefficient that converts δλ into the amount of change in the rotary stage angle θ.

$$\theta = \theta - \lambda k \cdot \delta \lambda$$

where $\lambda k = \Delta \theta / \delta \lambda$.

The spectrum controller 7 is configured to thereafter transmit the stage angle control signal that causes the rotary stage angle to be equal to θ to the rotary stage 14 of the line narrowing module 10.

(Spectral Linewidth Control)

Based on the difference ΔΔλ between the measured spectral linewidth Δλ and the target spectral linewidth Δλt, the spectrum controller 7 is configured to transmit the stage position control signal that allows ΔΔλ to approach zero to the actuator 64 for the linear stage 63 in the spectrum changer 60. The stage position control signal controls the stage position (position X) of the linear stage 63. As a result, the spectral linewidth Δλ of the pulsed laser light Lp having exited via the output coupling mirror 35 can approach the target spectral linewidth Δλt. Specifically, the spectrum controller 7 performs the following spectral linewidth control.

Figure 6:
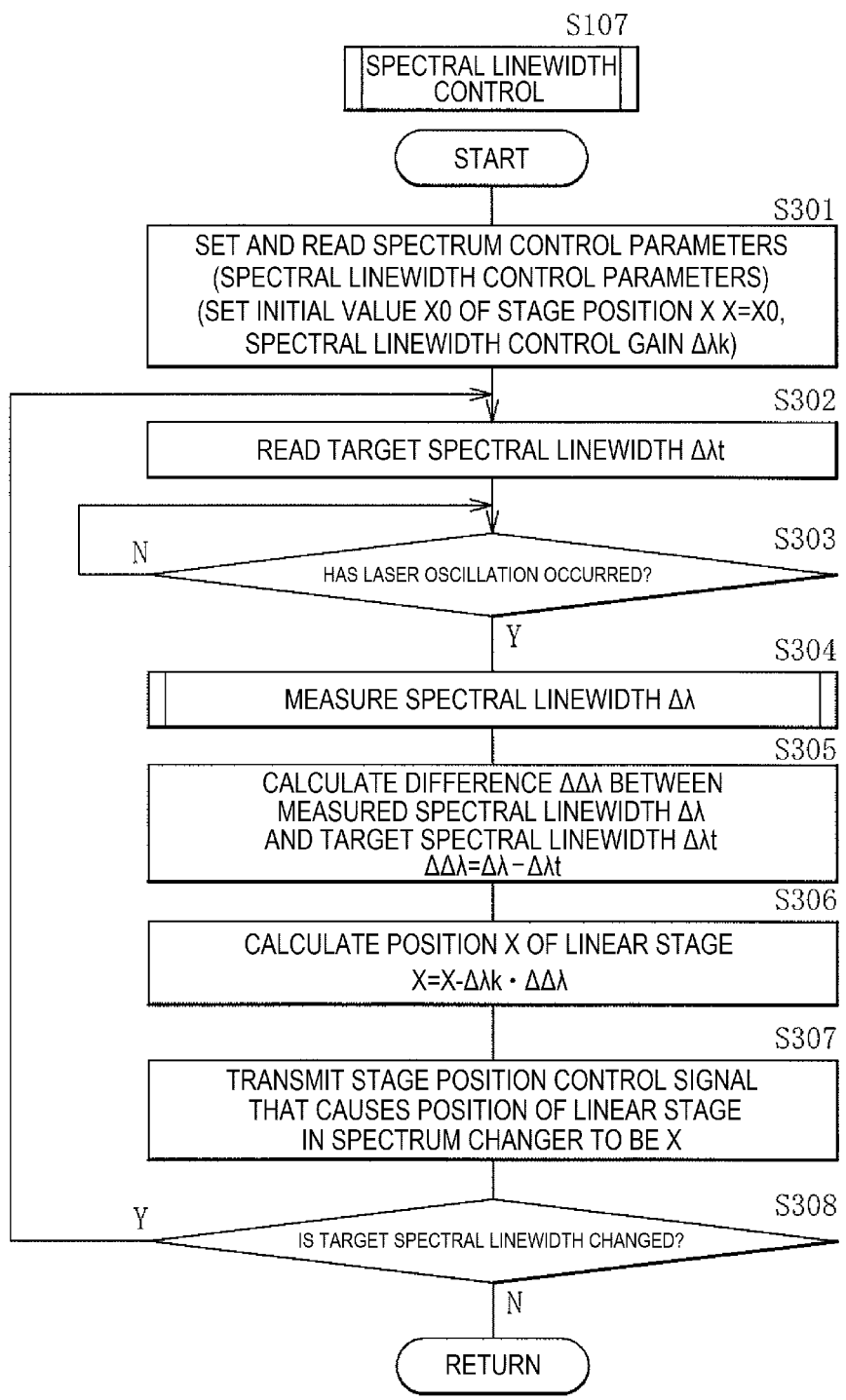
FIG. 6 is a flowchart showing an example of the procedure of control relating to spectral linewidth control in the laser apparatus according to Comparative Example.

FIG. 6 is a flowchart showing an example of the procedure of control relating to the spectral linewidth control performed by the spectrum controller 7 in the laser apparatus 101.

The spectrum controller 7 sets and reads the spectral linewidth control parameters out of the spectrum control parameters Pλc (step S301). In this process, the spectrum controller 7 sets the initial value of the position X of the linear stage 63 of the spectrum changer 60 at X0. The spectrum controller 7 further reads the spectral linewidth control gain ΔλK via the laser controller 2.

The spectrum controller 7 then reads the target spectral linewidth Δλt from the exposure apparatus controller 5 via the laser controller 2 (step S302).

The spectrum controller 7 then evaluates whether or not the laser oscillation has occurred (step S303). When the result of the evaluation shows that the laser oscillation has not occurred (N in step S303), the spectrum controller 7 repeats the process in step S303.

On the other hand, when the result of the evaluation shows that the laser oscillation has occurred (Y in step S303), the spectrum controller 7 causes the spectrum measurer 34 to measure the spectral linewidth Δλ (step S304).

The spectrum controller 7 then calculates the difference ΔΔλ between the measured spectral linewidth Δλ and the target spectral linewidth Δλt (=Δλ−Δλt) (step S305).

The spectrum controller 7 then calculates the following position X of the linear stage 63 based on the Δλ (step S306), as shown by the following expression. That is, the spectrum controller 7 subtracts ΔλK·ΔΔλ from the position X of the linear stage 63 at the time of the measurement of the spectral linewidth to calculate the following position X of the linear stage 63. The spectral linewidth control gain ΔλK is a proportional coefficient that converts ΔΔλ into the amount of change in the position X.

$$X = X - \Delta \lambda k \cdot \Delta \Delta \lambda$$

where $\Delta \lambda k = \Delta X / \Delta \Delta \lambda$.

The spectrum controller 7 then transmits the stage position control signal that causes the position of the linear stage 63 to be X to the actuator 64 for the linear stage 63 in the spectrum changer 60 (step S307).

The spectrum controller 7 then evaluates whether or not the target spectral linewidth Δλt is changed (step S308). When the result of the evaluation shows that the target spectral linewidth Δλt is changed (Yin step S308), the spectrum controller 7 returns to the process in step S302.

On the other hand, when the result of the evaluation shows that the target spectral linewidth Δλt is not changed (N in step S308), the spectrum controller 7 terminates the processes of the spectral linewidth control.

The variety of types of control described above have been described with reference to the case where the variety of control gains are each a proportional coefficient. The variety of control gains may instead each be a differential control coefficient or an integral control coefficient based on proportional-integral-differential (PID) control.

(Measurement of Spectral Linewidth)

The laser apparatus 101 is configured to perform the following measurement of the spectral linewidth $\Delta\lambda$ as the subroutine in step S304 in FIG. 6.

The spectrum controller 7 is configured to integrate the spectral waveforms of a plurality of pulses measured with the spectrum measurer 34 over a number of integration actions Ni. The number of integration actions Ni is the number of spectral waveforms to be integrated into one integrated waveform Oi. The spectrum controller 7 is configured to calculate the spectral linewidth $\Delta\lambda$ based on the integrated waveform Oi resulting from the integration. In this process, the spectrum controller 7 is configured to average Na integrated waveforms Oi. Na is the number of actions of averaging the integrated waveforms Oi. In the combination of Ni and Na (Ni, Na), Ni and Na may, for example, be 8 and 5, respectively, ((Ni, Na)=(8, 5)). Conversely, in the combination of Ni and Na (Ni, Na), Ni and Na may, for example, be 5 and 8, respectively, ((Ni, Na)=(5, 8)).

Figure 7:
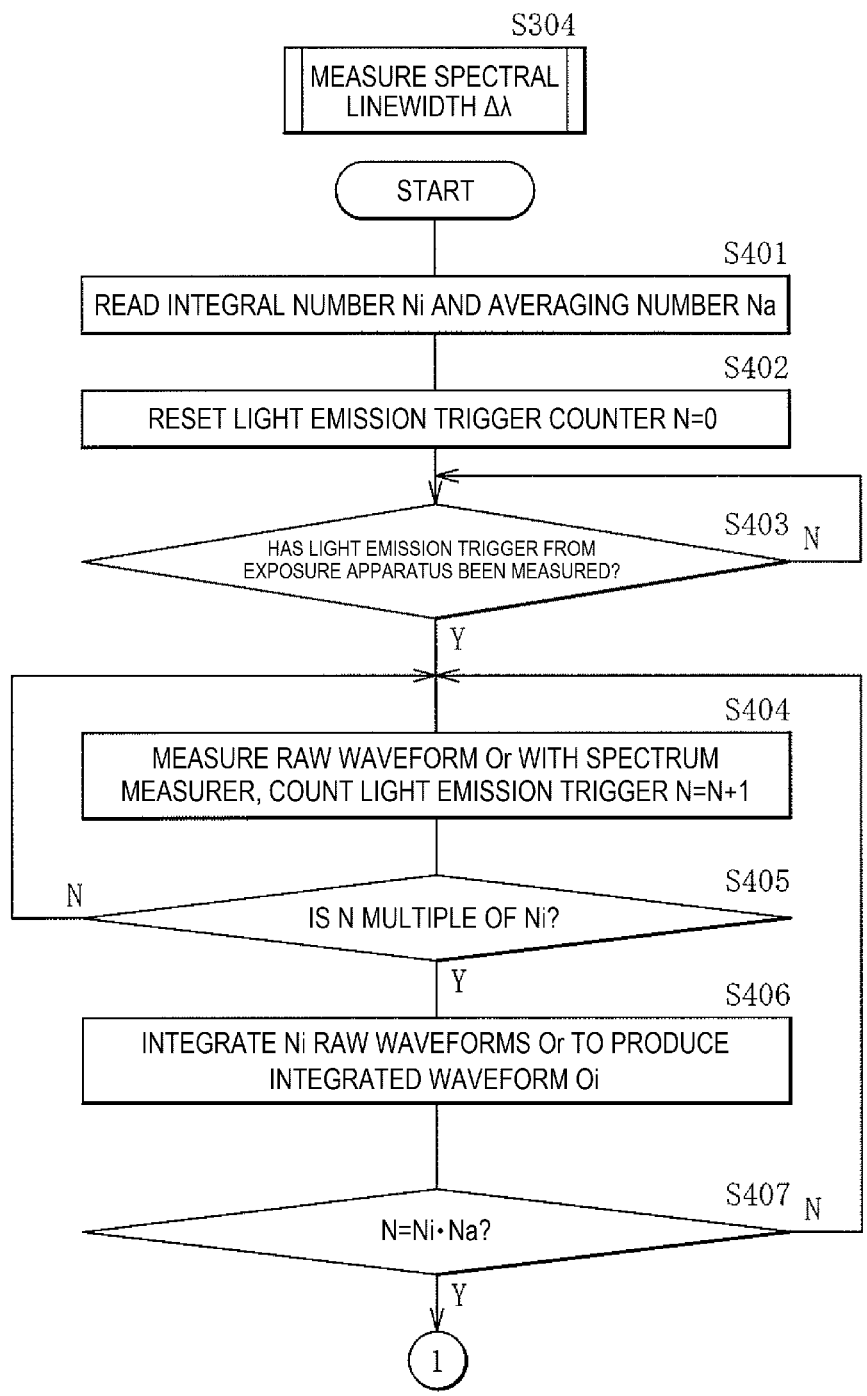
FIG. 7 is a flowchart showing an example of the procedure of spectral linewidth measurement operation performed by a spectrum controller in the laser apparatus according to Comparative Example.
Figure 8:
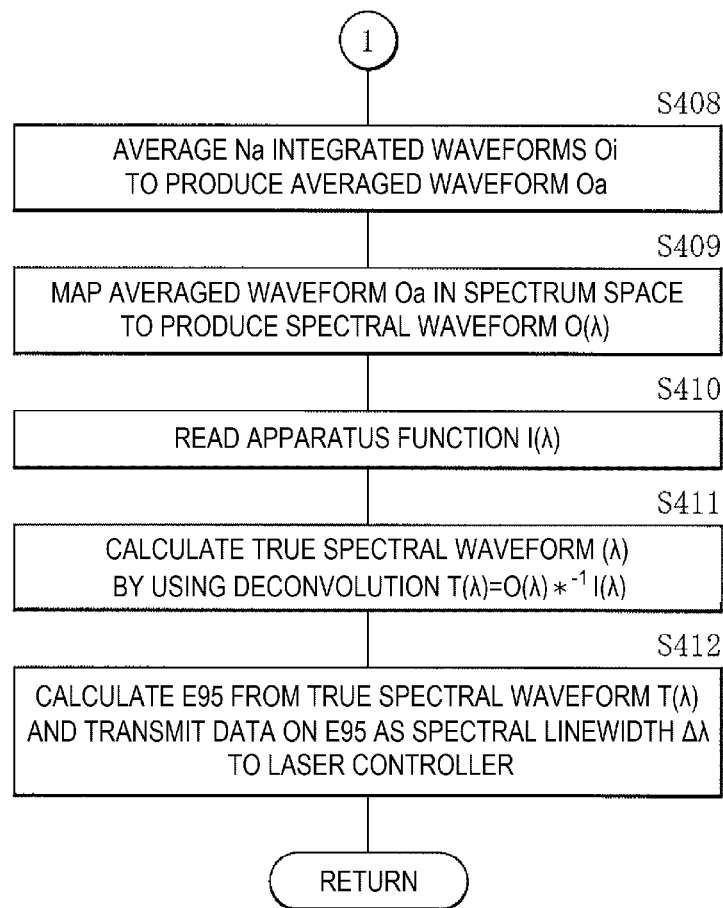
FIG. 8 is a flowchart that follows the flowchart of FIG. 7.

FIGS. 7 and 8 are flowcharts showing an example of the procedure of the operation of measuring the spectral linewidth $\Delta\lambda$ performed by the spectrum controller 7 in the laser apparatus 101 according to Comparative Example.

The spectrum controller 7 first reads data on the number of integration actions Ni and the number of averaging actions Na from the laser controller 2 (step S401).

The spectrum controller 7 then resets the counter value N of a light emission trigger counter at 0 (step S402). The light emission trigger counter is a counter that counts the light emission trigger signal Str.

The spectrum controller 7 evaluates whether or not the light emission trigger signal Str from the exposure apparatus 4 has been successfully measured (step S403). When the result of the evaluation shows that the light emission trigger signal Str has not been successfully measured (N in step S403), the spectrum controller 7 repeats the process in step S403.

When the result of the evaluation shows that the light emission trigger signal Str has been successfully measured (Y in step S403), the spectrum controller 7 then causes the spectrum measurer 34 to measure a raw spectral waveform Or (step S404). In this process, the spectrum controller 7 sets the counter value N of the light emission trigger counter at N+1.

The spectrum controller 7 then evaluates whether or not the counter value N of the light emission trigger counter is a multiple of Ni (step S405). When the result of the evaluation shows that the counter value N is not a multiple of Ni (N in step S405), the spectrum controller 7 returns to the process in step S404.

When the result of the evaluation shows that the counter value N is a multiple of Ni (Y in step S405), the spectrum controller 7 then integrates Ni raw waveforms Or to produce an integrated waveform Oi (step S406).

The spectrum controller 7 then evaluates whether or not the counter value N of the light emission trigger counter is equal to the product of Ni and Na (N=Ni·Na) (step S407). When the result of the evaluation shows that N=Ni·Na is not achieved (N in step S407), the spectrum controller 7 returns to the process in step S404.

When the result of the evaluation shows that N=Ni·Na is achieved (Y in step S407), the spectrum controller 7 then produces an averaged waveform Oa, which is the average of Na integrated waveforms Oi (step S408).

The spectrum controller 7 then maps the averaged waveform Oa in a spectrum space to produce a spectral waveform $O(\lambda)$ (step S409).

The thus produced spectral waveform $O(\lambda)$ is a spectral waveform deformed due to the effect of an apparatus function $I(\lambda)$ of the spectrum measurer 34. Therefore, even when the spectral linewidth $\Delta\lambda$ is directly determined from the spectral waveform $O(\lambda)$, the determined spectral linewidth $\Delta\lambda$ differs from the spectral linewidth $\Delta\lambda$ obtained from a true spectral waveform $T(\lambda)$ of the laser light. To perform correct spectral linewidth control, it is necessary to determine the true spectral waveform $T(\lambda)$ of the laser light.

When the result of convolution integration of the true spectral waveform $T(\lambda)$ by using the apparatus function $I(\lambda)$ is the spectral waveform $O(\lambda)$, the true spectral waveform $T(\lambda)$ is theoretically obtained by performing deconvolution on the spectral waveform $O(\lambda)$ by using the apparatus function $I(\lambda)$. The deconvolution is performed by a repetitive process, such as Fourier transformation, the Yacobi method, and the Gauss/Seidel method.

The spectrum controller 7 therefore produces the spectral waveform $O(\lambda)$ in step S409 and then reads data on the apparatus function $I(\lambda)$ of the spectrum measurer 34 from the laser controller 2 (step S410). The spectrum controller 7 then performs the deconvolution to calculate the true spectral waveform $T(\lambda)$, as shown by the following expression (step S411). The symbol * represents convolution integration, and the symbol $*^{-1}$ represents deconvolution.

$$T(\lambda)=O(\lambda)*^{-1}I(\lambda)$$

The spectrum controller 7 then calculates E95 from the true spectral waveform $T(\lambda)$ and transmits data on E95 as the spectral linewidth $\Delta\lambda$ to the laser controller 2 (step S412). The spectrum controller 7 then proceeds to the process in step S305 in FIG. 6.

1.3 Problems

As described above, in the gas pressure control, the gas controller 9 is configured to control the laser gas supplier 91 and the laser gas exhauster 92 in accordance with the value of the charge voltage V to cause the laser gas supplier 91 or the laser gas exhauster 92 to inject or exhaust the laser gas (steps S205 to S207 in FIG. 5).

In the spectral linewidth control, the spectrum controller 7 is configured to calculate the difference $\Delta\Delta\lambda$ between the measured spectral linewidth $\Delta\lambda$ and the target spectral linewidth $\Delta\lambda t$ and use the spectral linewidth control gain $\Delta\lambda k$ to convert the difference $\Delta\Delta\lambda$ into the amount of change in the position X of the linear stage 63 (steps S305 to S306 in FIG. 6). The spectrum controller 7 is configured to thereafter control the position of the linear stage 63 with the actuator 64 in such a way that the linear stage 63 moves to the position X.

In the measurement of the spectral linewidth $\Delta\lambda$, the spectrum controller 7 is configured to integrate the raw waveforms Or of Ni spectra measured with the spectrum measurer 34 to calculate the integrated waveform Oi and average Na integrated waveforms Oi to produce the averaged waveform Oa, as shown in FIGS. 7 and 8. The spectrum controller 7 is configured to calculate E95 as the spectral linewidth $\Delta\lambda$ based on the averaged waveform Oa.

E95 as the target spectral linewidth $\Delta\lambda t$ is greatly changed in some cases in accordance with an instruction from the exposure apparatus 4. In this case, the following problems occur.

Figure 9:
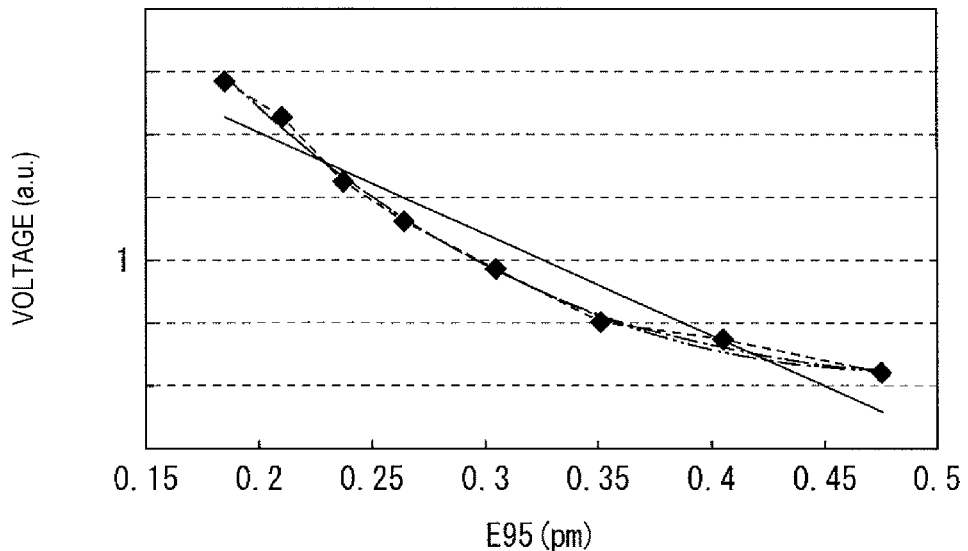
FIG. 9 shows an example of the relationship between the spectral linewidth and charge voltage.

FIG. 9 shows an example of the relationship between the spectral linewidth $\Delta\lambda$ and voltage HV applied between the pair of discharge electrodes 23 and 24. In FIG. 9, the horizontal axis represents E95, and the vertical axis represents the applied voltage HV in the form of a relative value. When the spectral linewidth Δλ greatly changes, the energy efficiency changes, and the resultant energy control changes the applied voltage HV. Therefore, in the gas pressure control, intrinsically unnecessary operation of injecting or exhausting the laser gas is performed in some cases.

Figure 10:
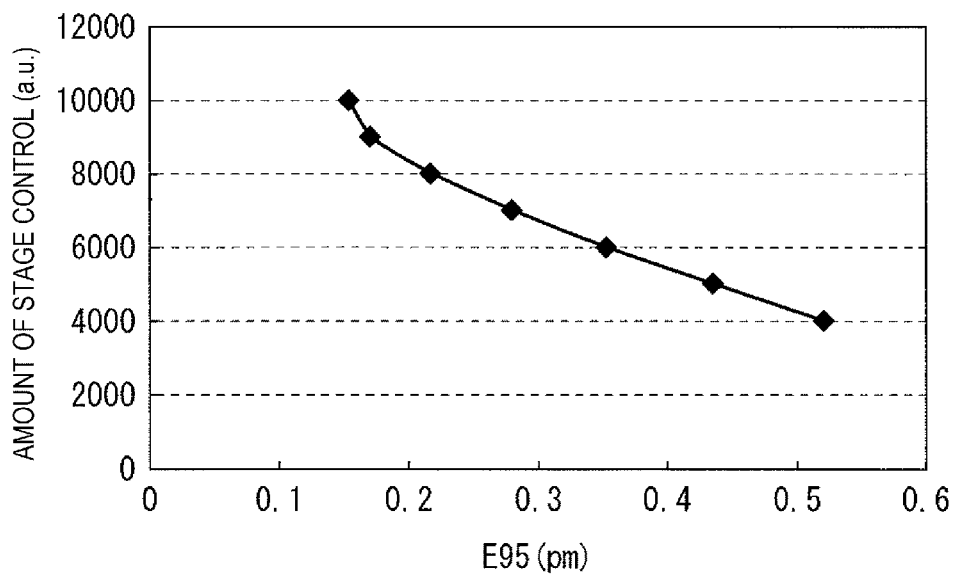
FIG. 10 shows an example of the relationship between the spectral linewidth and the amount of stage control.

FIG. 10 shows an example of the relationship between the spectral linewidth Δλ and the amount of stage control. In FIG. 10, the horizontal axis represents E95, and the vertical axis represents the amount of stage control in the form of a relative value. The amount of stage control is the amount of control in which the actuator 64 controls the position X of the linear stage 63 in the spectrum changer 60. FIG. 10 shows that the spectral linewidth control gain Δλk changes in accordance with the spectral linewidth Therefore, in the case where the amount of stage control is calculated based on the spectral linewidth control gain Δλk as the proportional coefficient, an error of the amount of stage control increases in some cases when the target spectral linewidth Δλt greatly changes. As a result, the controllability of the spectral linewidth Δλ deteriorates.

Figure 11:
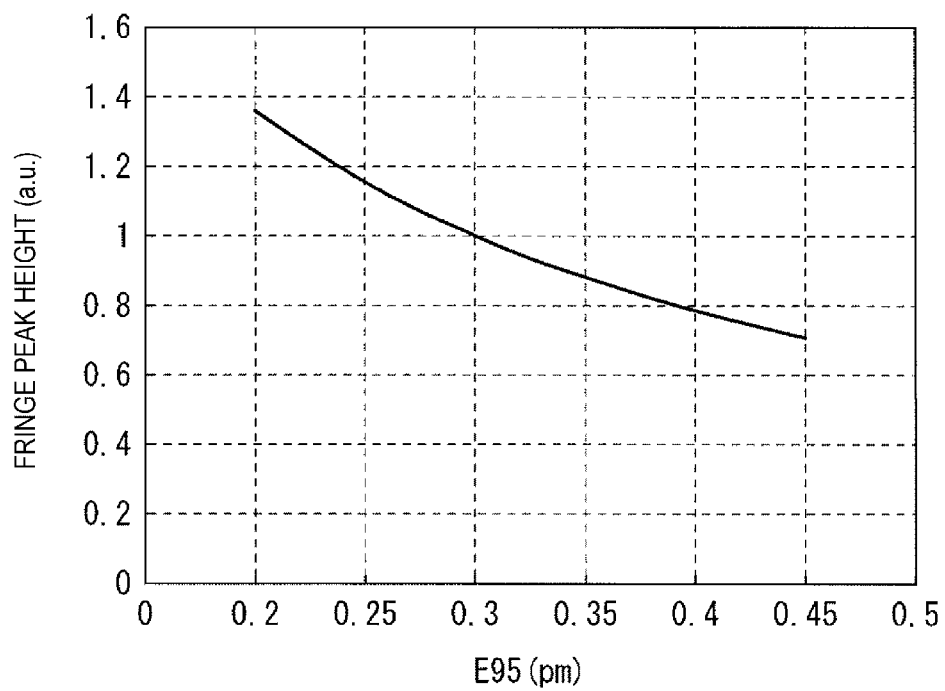
FIG. 11 shows an example of the relationship between the spectral linewidth and a fringe peak height.

FIG. 11 shows an example of the relationship between the spectral linewidth and a fringe peak height. In FIG. 11, the horizontal axis represents E95, and the vertical axis represents the fringe peak height in the form of a relative value. The fringe peak height is a peak value of interference fringes measured with the spectrum measurer 34. The change in the spectral linewidth Δλ changes the peak optical quantity of the spectrum measured with the spectrum measurer 34. As a result, in the measurement of the spectral linewidth λk, the optical quantity saturates and the S/N ratio deteriorates.

2. FIRST EMBODIMENT

Example of Improvement in Gas Pressure Control

A laser apparatus according to a first embodiment of the present disclosure will next be described. In the following description, substantially the same portions as the components of the laser apparatus 101 according to Comparative Example described above have the same reference characters and will not be described as appropriate.

2.1 Configuration

The basic configuration of the laser apparatus according to the first embodiment is substantially the same as that of the laser apparatus 101 according to Comparative Example described above. The gas pressure control operation performed by the gas controller 9, however, partially differs, as will be described below.

2.2 Operation

In the laser apparatus according to the first embodiment, when the value of the target spectral linewidth Δλt changes from a first target value to a second target value, the gas controller 9 is configured to correct the voltage HV used in the gas pressure control based on a first function having the second target value as a parameter. The gas controller 9 is configured to control the gas pressure based on the corrected voltage HV. The voltage HV corresponds to the charge voltage V controlled by the energy control. The first function is a gas pressure linewidth function f1(x), which converts the difference between the spectral linewidth Δλ and a reference spectral linewidth Δλa (Δλ−Δλa) into the difference in the amount of change in the voltage HV. The spectral linewidth Δλ corresponds to the second target value of the target spectral linewidth Δλt. The reference spectral linewidth Δλa corresponds to the first target value of the target spectral linewidth Δλt. The gas pressure linewidth function f1(x) may be any of a linear function, a polynomial function, and an exponential function. The gas pressure control using the gas pressure linewidth function f1(x) is specifically performed, for example, as follows.

Figure 12:
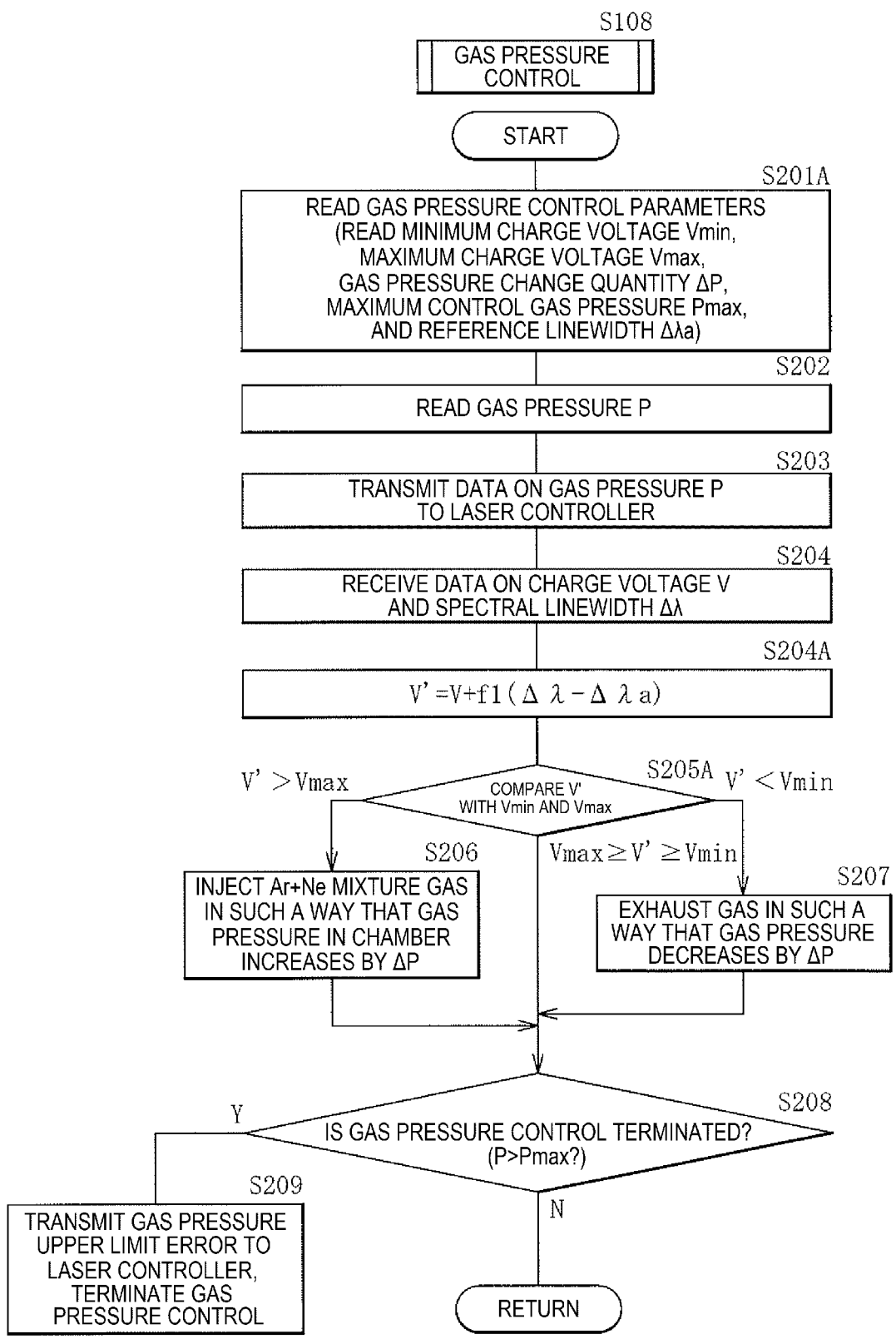
FIG. 12 is a flowchart showing an example of the procedure of control relating to gas pressure control performed by a gas controller in a laser apparatus according to a first embodiment.

FIG. 12 is a flowchart showing an example of the procedure of control relating to the gas pressure control performed by the gas controller 9 in the laser apparatus according to the first embodiment. The laser apparatus according to the first embodiment is configured to perform gas pressure control shown in FIG. 12 in place of the gas pressure control shown in FIG. 5. In FIG. 12, a step in which a process similar to the process in a step in the flowchart shown in FIG. 5 is carried out has the same step number.

The gas controller 9 reads the gas pressure control parameters out of the gas control parameters Pgs (step S201A). In this process, the gas controller 9 reads the minimum charge voltage Vmin, the maximum charge voltage Vmax, the maximum control gas pressure Pmax, and the gas pressure change quantity ΔP as the gas pressure control parameters via the laser controller 2. The gas controller 9 further reads the gas pressure linewidth function f1(x) and data on the reference linewidth Δλa as the gas pressure control parameters via the laser controller 2.

The gas controller 9 then reads the gas pressure P in the laser chamber 20 measured with the pressure sensor (step S202). The gas controller 9 then transmits data on the measured gas pressure P to the laser controller 2 (step S203). Further, the gas controller 9 receives the data on the charge voltage V and the spectral linewidth Δλ via the laser controller 2 (step S204).

The gas controller 9 then corrects the charge voltage V to V' based on the gas pressure linewidth function f1(x) (step S204A), as shown by the following expression:

$$V'=V+f1(\Delta\lambda-\Delta\lambda a)$$

The gas controller 9 then compares the value of the corrected charge voltage V' with the minimum charge voltage Vmin, which is a first threshold, and the maximum charge voltage Vmax, which is a second threshold (step S205A). When Vmax≥V'≥Vmin is satisfied, the gas controller 9 evaluates whether or not the gas pressure control is terminated (step S208). The evaluation of whether or not the gas pressure control is terminated is performed, for example, by evaluation of whether or not the measured gas pressure P is greater than the maximum control gas pressure Pmax.

When the corrected charge voltage V' is greater than the second threshold (V'>Vmax), the gas controller 9 controls the laser gas supplier 91 to cause it to inject the Ar+Ne mixture gas into the laser chamber 20 in such a way that the gas pressure P in the laser chamber 20 increases by the gas pressure change quantity ΔP (step S206). The gas controller 9 then evaluates whether or not the gas pressure control is terminated (step S208).

When the corrected charge voltage V' is smaller than the first threshold (V'<Vmin), the gas controller 9 controls the laser gas exhauster 92 to cause it to exhaust the gas in the laser chamber 20 in such a way that the gas pressure P in the laser chamber 20 decreases by the gas pressure change quantity ΔP (step S207). The gas controller 9 then evaluates whether or not the gas pressure control is terminated (step S208).

When the result of the evaluation shows that the gas pressure control is not terminated (N in step S208), the gas controller 9 repeats the processes of the gas pressure control. On the other hand, when the result of the evaluation shows that the gas pressure control is terminated (Y in step S208), the gas controller 9 transmits the gas pressure upper limit error signal representing that the gas pressure P has reached the maximum control gas pressure Pmax to the laser controller 2 and terminates the processes of the gas pressure control (step S209).

The charge voltage V may be substantially equal to the corrected charge voltage V' depending on the value of the spectral linewidth $\Delta\lambda$.

The other operation may be substantially the same as the operation performed by the laser apparatus 101 according to Comparative Example described above.

2.3 Effects and Advantages

The laser apparatus according to the first embodiment is configured to reduce the effect of a change in the applied voltage HV due to a change in the spectral linewidth $\Delta\lambda$ on the gas pressure control, whereby precise gas pressure control can be performed irrespective of the spectral linewidth $\Delta\lambda$. As a result, high laser performance can be maintained.

3. SECOND EMBODIMENT

Example of Improvement in Spectral Linewidth Control

A laser apparatus according to a second embodiment of the present disclosure will next be described. In the following description, substantially the same portions as the components of the laser apparatus according to Comparative Example described above or the first embodiment described above have the same reference characters and will not be described as appropriate.

3.1 Configuration

The basic configuration of the laser apparatus according to the second embodiment is substantially the same as that of the laser apparatus 101 according to Comparative Example described above. The spectral linewidth control operation performed by the spectrum controller 7, however, partially differs, as will be described below.

3.2 Operation

In the laser apparatus according to the second embodiment, when the value of the target spectral linewidth $\Delta\lambda t$ changes from the first target value to the second target value, the spectrum controller 7 is configured to determine the stage position (position X) of the linear stage 63 based on a second function that converts the second target value into the stage position and control the actuator 64 in such a way that the position X of the linear stage 63 is the determined position. A spectral linewidth function f2(x), which converts the spectral linewidth $\Delta\lambda$ into the position X of the linear stage 63, is used as the second function. The spectrum linewidth function f2(x) may be any of a linear function, a polynomial function, a power function, and an exponential function. The spectral linewidth control using the spectral linewidth function f2(x) is specifically performed, for example, as follows.

Figure 13:
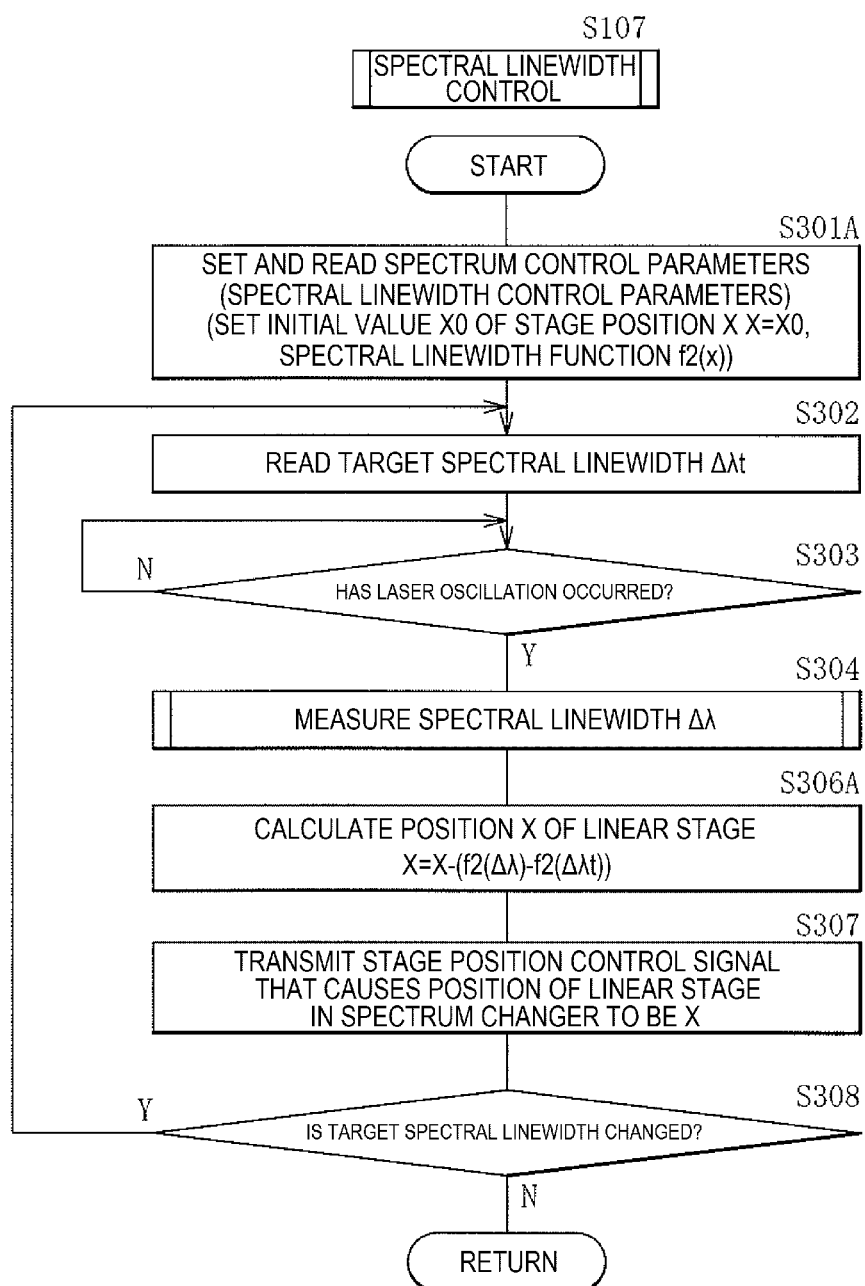
FIG. 13 is a flowchart showing an example of the procedure of control relating to spectral linewidth control performed by a spectrum controller in a laser apparatus according to a second embodiment.

FIG. 13 is a flowchart showing an example of the procedure of control relating to the spectral linewidth control performed by the spectrum controller 7 in the laser apparatus according to the second embodiment. The laser apparatus according to the second embodiment is configured to perform spectral linewidth control shown in FIG. 13 in place of the spectral linewidth control shown in FIG. 6. In FIG. 13, a step in which a process similar to the process in a step in the flowchart shown in FIG. 6 is carried out has the same step number.

The spectrum controller 7 sets and reads the spectral linewidth control parameters out of the spectrum control parameters P$\lambda$c (step S301A). In step S301A, the spectrum controller 7 sets the initial value of the position X of the linear stage 63 in the spectrum changer 60 at X0. The spectrum controller 7 further reads the spectral linewidth function f2(x) via the laser controller 2.

The spectrum controller 7 then reads the target spectral linewidth $\Delta\lambda t$ from the exposure apparatus controller 5 via the laser controller 2 (step S302).

The spectrum controller 7 then evaluates whether or not the laser oscillation has occurred (step S303). When the result of the evaluation shows that the laser oscillation has not occurred (N in step S303), the spectrum controller 7 repeats the process in step S303.

On the other hand, when the result of the evaluation shows that the laser oscillation has occurred (Y in step S303), the spectrum controller 7 causes the spectrum measurer 34 to measure the spectral linewidth $\Delta\lambda t$ (step S304).

The spectrum controller 7 then calculates the position X of the linear stage 63 by using the spectral linewidth function f2(x) (step S306A), as shown by the following expression:

$$X=X-(f2(\Delta\lambda)-f2(\Delta\lambda t))$$

The spectrum controller 7 then transmits the stage position control signal that causes the position of the linear stage 63 to be the position X determined in step S306A to the actuator 64 for the linear stage 63 in the spectrum changer 60 (step S307).

The spectrum controller 7 then evaluates whether or not the target spectral linewidth $\Delta\lambda t$ is changed (step S308). When the result of the evaluation shows that the target spectral linewidth $\Delta\lambda t$ is changed (Yin step S308), the spectrum controller 7 returns to the process in step S302.

On the other hand, when the result of the evaluation shows that the target spectral linewidth $\Delta\lambda t$ is not changed (N in step S308), the spectrum controller 7 terminates the processes of the spectral linewidth control.

The other operation may be substantially the same as the operation performed by the laser apparatus 101 according to Comparative Example described above or the laser apparatus according to the first embodiment described above.

For example, in the laser apparatus according to the second embodiment, the gas pressure control shown in FIG. 12 may be performed as the gas pressure control in the second embodiment, as in the first embodiment described above.

3.3 Effects and Advantages

The laser apparatus according to the second embodiment allows precise acquisition of the position X of the linear stage 63 according to the spectral linewidth $\Delta\lambda$, whereby the stage controllability is improved. As a result, the controllability of the spectral linewidth $\Delta\lambda$ is improved.

When the same gas pressure control as in the first embodiment described above is performed, the same advantages and effects as those provided by the laser apparatus according to the first embodiment described above can also be provided.

4. THIRD EMBODIMENT

Example of Improvement in Spectral Linewidth Measurement

A laser apparatus according to a third embodiment of the present disclosure will next be described. In the following description, substantially the same portions as the components of the laser apparatus according to Comparative Example described above or the first or second embodiment described above have the same reference characters and will not be described as appropriate.

4.1 Configuration

The basic configuration of the laser apparatus according to the third embodiment is substantially the same as that of the laser apparatus 101 according to Comparative Example described above. The operation of measuring the spectral linewidth $\Delta\lambda$ performed by the spectrum controller 7, however, partially differs, as will be described below.

4.2 Operation

The spectrum controller 7 is configured to change the number of pulses to be integrated, that is, the number of integration actions Ni in the measurement of the spectral linewidth $\Delta\lambda$ in accordance with the value of the target spectral linewidth $\Delta\lambda t$ in such a way that the peak optical quantity of the integrated waveform Oi approaches a desired optical quantity. When the value of the target spectral linewidth $\Delta\lambda t$ changes from the first target value to the second target value, the spectrum controller 7 is configured to change the number of pulses to be integrated, that is the number of integration actions Ni based on a third function having the second target value as a parameter. In this process, the number of averaging actions Na, over which the integrated waveforms Oi are averaged, is also changed. A calculation function f3(x) adapted to the target spectral linewidth $\Delta\lambda t$ is used as the third function. The calculation function f3(x) may be any of a linear function, a polynomial function, and an exponential function. The measurement of the spectral linewidth $\Delta\lambda$ using the calculation function f3(x) is specifically performed, for example, as follows.

Figure 14:
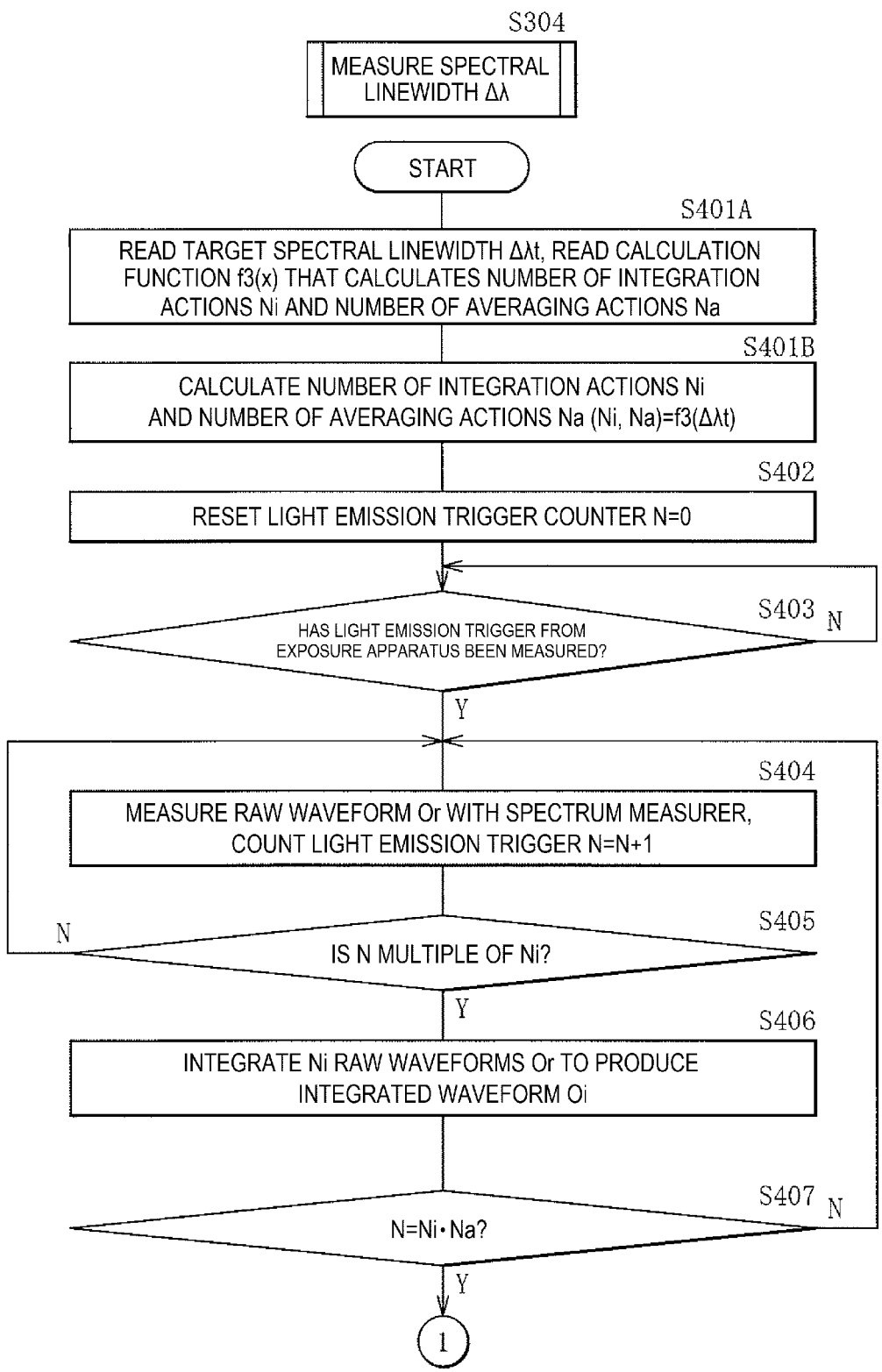
FIG. 14 is a flowchart showing an example of spectral linewidth measurement operation performed by a spectrum controller in a laser apparatus according to a third embodiment.

FIG. 14 is a flowchart showing an example of the procedure of the operation of measuring the spectral linewidth $\Delta\lambda$ performed by the spectrum controller 7 in the laser apparatus according to the third embodiment. The laser apparatus according to the third embodiment is configured to perform the operation of measuring the spectral linewidth $\Delta\lambda$ shown in FIG. 14 in place of the operation of measuring the spectral linewidth $\Delta\lambda$ shown in FIG. 7. In FIG. 14, a step in which a process similar to the process in a step in the flowchart shown in FIG. 7 is carried out has the same step number.

The spectrum controller 7 first reads data on the target spectral linewidth $\Delta\lambda t$ from the laser controller 2 (step S401A). The spectrum controller 7 further reads the calculation function f3(x), which calculates the number of integration actions Ni and the number of averaging actions Na, from the laser controller 2.

The spectrum controller 7 then uses the calculation function f3(x) to calculate the number of integration actions Ni and the number of averaging actions Na adapted to the target spectral linewidth $\Delta\lambda$ (step S401B). The spectrum controller 7 calculates a combination of Ni and Na (Ni, Na) as follows:

$$(Ni, Na) = f3(\Delta\lambda t)$$

The calculated number of integration actions Ni and number of averaging actions Na are used to calculate the spectral linewidth $\Delta\lambda$, as in the operation in step S402 and the following steps in FIG. 7.

The other operation may be substantially the same as the operation performed by the laser apparatus 101 according to Comparative Example described above or the laser apparatus according to the first or second embodiment described above.

For example, in the laser apparatus according to the third embodiment, the gas pressure control shown in FIG. 12 may be performed as the gas pressure control in the third embodiment, as in the first embodiment described above.

Further, in the laser apparatus according to the third embodiment, the spectral linewidth control shown in FIG. 13 may be performed as the spectral linewidth control in the third embodiment, as in the second embodiment described above.

4.3 Effects and Advantages

Since the laser apparatus according to the third embodiment can use the number of integration actions Ni according to the target spectral linewidth $\Delta\lambda t$, a decrease in the S/N ratio due to an insufficient peak optical quantity of a spectral waveform or saturation of the peak optical quantity can be suppressed, whereby the accuracy of the measurement of the spectral linewidth $\Delta\lambda$ can be increased.

When the same gas pressure control as in the first embodiment described above is performed, the same advantages and effects as those provided by the laser apparatus according to the first embodiment described above can also be provided. When the same spectral linewidth control as in the second embodiment described above is performed, the same advantages and effects as those provided by the laser apparatus according to the second embodiment described above can also be provided.

5. FOURTH EMBODIMENT

Specific Example of Spectrum Measurer

A specific example of the spectrum measurer 34 adapted to the laser apparatus according to any of the first to third embodiments described above will next be described as a fourth embodiment of the present disclosure. In the following description, substantially the same portions as the components of the laser apparatus according to Comparative Example described above or any of the first to third embodiments described above have the same reference characters and will not be described as appropriate.

5.1 Configuration

Figure 15:
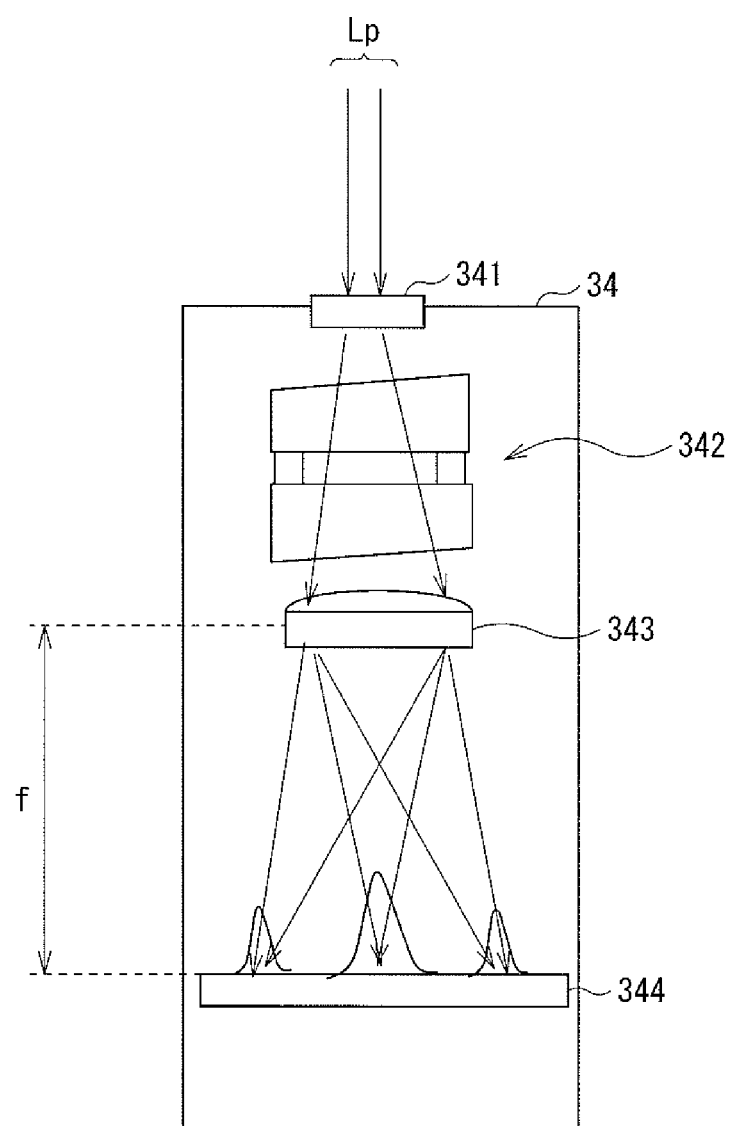
FIG. 15 schematically shows an example of the configuration of a spectrum measurer used in the laser apparatus according to any of the first to third embodiments.

FIG. 15 schematically shows an example of the configuration of the spectrum measurer 34 adapted to the laser apparatus according to any of the first to third embodiments described above. FIG. 15 schematically shows an example of the configuration in a case where the spectrum measurer 34 is a monitor etalon spectrometer.

In the example of the configuration shown in FIG. 15, the spectrum measurer 34 includes a diffuser 341, a monitor etalon 342, a light collection lens 343, and an image sensor 344. The image sensor 344 may be a photodiode array. The reference character f represents the focal length of the light collection lens 343.

5.2 Operation

In the laser apparatus 101 shown in FIG. 1, the beam splitters 31 and 32 separate part of the pulsed laser light Lp having exited via the output coupling mirror 35 as sample light used to detect the pulse energy E, and the sample light enters the pulse energy measurer 33. On the other hand, the light having passed through the beam splitter 32 enters the spectrum measurer 34.

In the spectrum measurer 34, the pulsed laser light Lp first enters the diffuser 341. The diffuser 341 is configured to scatter the light incident thereon. The scattered light enters the monitor etalon 342. The light having passed through the monitor etalon 342 enters the light collection lens 343 and produces interference fringes in the focal plane of the light collection lens 343.

The image sensor 344 is disposed in the focal plane of the light collection lens 343. The image sensor 344 is configured to detect the interference fringes in the focal plane. The square of the radius r of the interference fringes is proportional to the wavelength $\lambda t$ of the pulsed laser light Lp. The detected interference fringes therefore allows detection of the spectral linewidth $\Delta\lambda$ and the central wavelength of the pulsed laser light Lp as the spectral profile thereof. The spectral linewidth $\Delta\lambda$ and the central wavelength may be determined by the spectrum measurer 34 or the spectrum controller 7 by using an information processor that is not shown based on the detected interference fringes.

The relationship between the radius r of the interference fringes and the wavelength $\lambda t$ can be expressed by the following approximation Expression (A):

$$\lambda = \lambda c + \alpha r^2 \tag{A}$$

where $\alpha$ represents a proportional constant, r represents the radius of the interference fringes, and $\Delta\lambda$ represents the wavelength at which the optical intensity is maximized at the center of the interference fringes.

Figure 16:
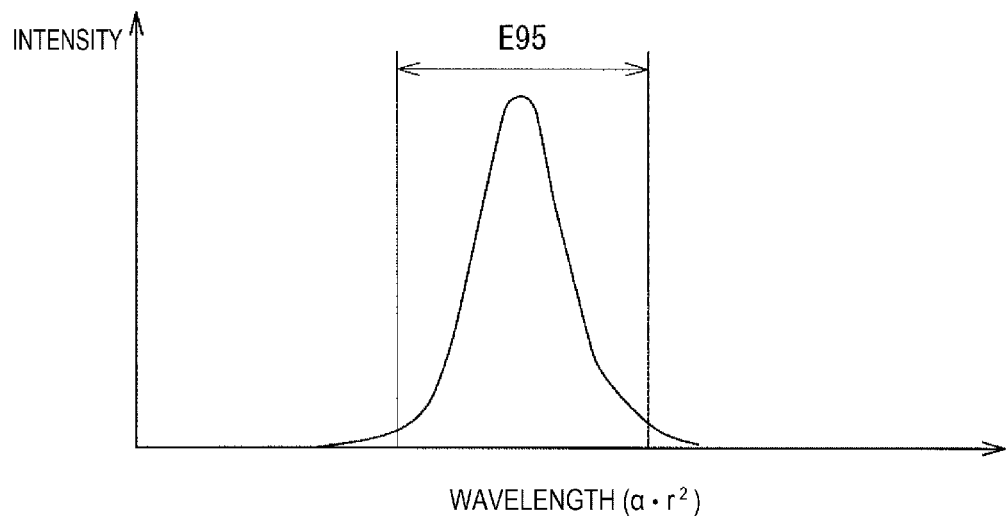
FIG. 16 diagrammatically shows an example of the spectral linewidth measured with the spectrum measurer shown in FIG. 15.

FIG. 16 diagrammatically shows an example of the spectral linewidth $\Delta\lambda$ measured with the spectrum measurer 34 shown in FIG. 15.

The interference fringes may each be converted into a spectral waveform showing the relationship between the optical intensity and the wavelength $\lambda$ based on Expression (1) described above, and then E95 may be calculated as the spectral linewidth $\Delta\lambda$. The spectral linewidth $\Delta\lambda$ may instead be the full width at half maximum of the spectral waveform.

Others

The fourth embodiment has been described with reference to the case where one monitor etalon 342 is configured to measure the wavelength $\lambda$ and the spectral linewidth $\Delta\lambda$, but not necessarily. For example, a plurality of monitor etalons having different resolutions may be arranged, and a plurality of linear sensors may be configured to measure the interference fringes. In this case, the focal length of the light collection lens 343 may be increased, and a monitor etalon having a small free spectral range (FSR) and having high resolution may be used to measure the spectral linewidth $\Delta\lambda$.

6. FIFTH EMBODIMENT

Method for Manufacturing Electronic Device

The laser apparatus according to any of the first to third embodiments described above can be used in a method for manufacturing an electronic device, such as a semiconductor device. A specific example of the method will be described below.

Figure 17:
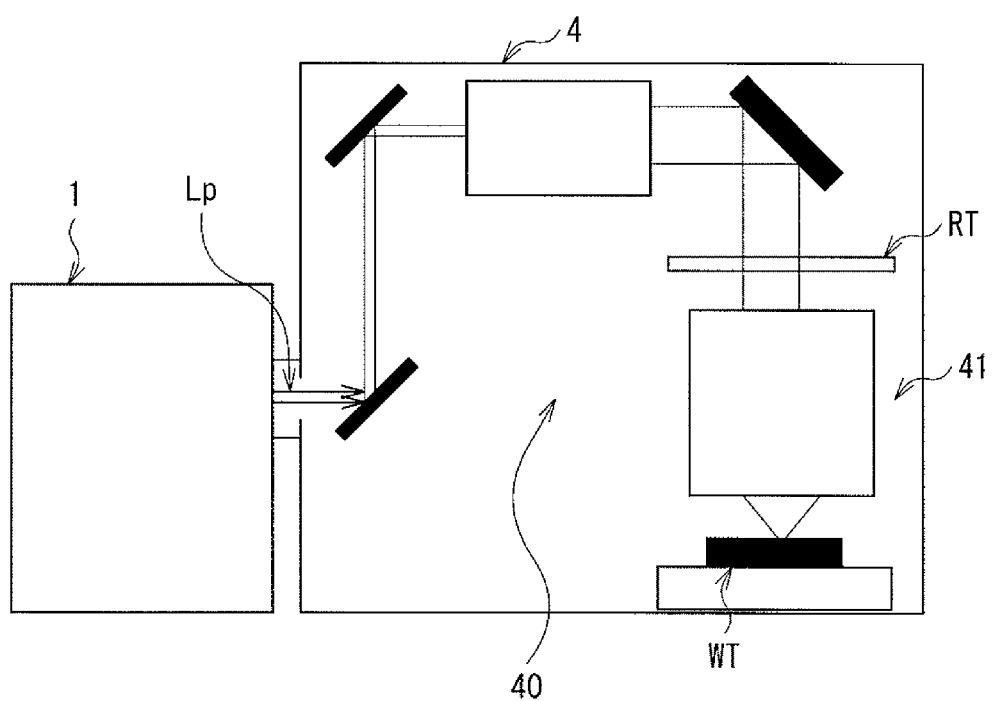
FIG. 17 schematically shows an example of the configuration of an exposure apparatus used to manufacture a semiconductor device.

FIG. 17 schematically shows an example of the configuration of the exposure apparatus 4 used to manufacture a semiconductor device.

In FIG. 17, the exposure apparatus 4 includes an illumination optical system 40 and a projection optical system 41.

The illumination optical system 40 is configured to illuminate a reticle pattern on a reticle stage RT with laser light incident from a laser system 1. The laser apparatus according to any of the first to third embodiments described above can be used as the laser system 1.

The projection optical system 41 is configured to perform reduction projection on the laser light having passed through the reticle to cause the laser light to be focused on a workpiece that is not shown but is placed on a workpiece table WT.

The workpiece is a light sensitive substrate on which a photoresist has been applied, such as a semiconductor wafer.

The exposure apparatus 4 is configured to translate the reticle stage RT and the workpiece table WT in synchronization with each other to expose the workpiece with the laser light having reflected the reticle pattern.

A semiconductor device is manufactured by using the exposure step described above. The semiconductor device can be manufactured by transferring a device pattern onto the semiconductor wafer in the exposure step described above.

7. OTHERS

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An excimer laser apparatus comprising:
    a chamber configured to accommodate a laser gas and a pair of electrodes and generate pulse-oscillating laser light when gas pressure of the laser gas is controlled in accordance with voltage applied between the pair of electrodes;
    a power supply configured to apply the voltage between the pair of electrodes;
    a controller to which a target value of a spectral linewidth of the laser light is inputted, the controller configured to correct the voltage used to control the gas pressure, when the target value changes from a first target value to a second target value, based on a first function having the second target value as a parameter and control the gas pressure in accordance with the corrected voltage; and a spectral waveform measurer configured to measure a plurality of spectral waveforms of pulses of the laser light, wherein the controller is configured to integrate the spectral waveforms of the plurality of pulses measured with the spectral waveform measurer over the number of pulses to be integrated (number of integration actions Ni) according to the first target value, calculate the spectral linewidth based on an integrated waveform provided by the integration, and change the number of pulses to be integrated based on a third function having the second target value as a parameter when the target value changes from the first target value to the second target value.

2. The excimer laser apparatus according to claim 1, wherein the third function includes any of a linear function, a polynomial function, and an exponential function.

3. The excimer laser apparatus according to claim 1, wherein the controller is configured to average the integrated waveforms over the number of averaging actions according to the first target value, calculate the spectral linewidth based on an averaged waveform provided by the averaging, and change the number of averaging actions based on the third function when the target value changes from the first target value to the second target value.

4. The excimer laser apparatus according to claim 1, further comprising:

a laser resonator so disposed in an optical path of the laser light as to sandwich the chamber; and a wavefront adjustor including a stage on which an optical member configured to adjust a wavefront of the laser light that travels back and forth through the laser resonator and an actuator configured to adjust a position of the stage, wherein when the target value changes from the first target value to the second target value, the controller is configured to determine the position of the stage based on a second function converting the second target value into the position of the stage and control the actuator in such a way that the position of the stage is the determined position.

5. The excimer laser apparatus according to claim 4, wherein the second function includes any of a linear function, a polynomial function, a power function, and an exponential function.

\* \* \* \* \*